(12) United States Patent
Baum et al.

(10) Patent No.: US 11,461,614 B2
(45) Date of Patent: Oct. 4, 2022

(54) DATA DRIVEN QUANTIZATION OPTIMIZATION OF WEIGHTS AND INPUT DATA IN AN ARTIFICIAL NEURAL NETWORK

(71) Applicant: Hailo Technologies Ltd., Ra'anana (IL)

(72) Inventors: Avi Baum, Givat Shmuel (IL); Or Danon, Kiryat Ono (IL); Daniel Ciubotariu, Ashdod (IL); Mark Grobman, Tel Aviv (IL); Alex Finkelstein, Ramat Gan (IL)

(73) Assignee: Hailo Technologies Ltd.

( * ) Notice: Subject to any disclaimer, the term of this patent is extended or adjusted under 35 U.S.C. 154(b) by 1053 days.

(21) Appl. No.: 15/838,552

(22) Filed: Dec. 12, 2017

(65) Prior Publication Data

US 2018/0285736 A1   Oct. 4, 2018

Related U.S. Application Data

(60) Provisional application No. 62/531,372, filed on Jul. 12, 2017, provisional application No. 62/481,492, filed on Apr. 4, 2017.

(51) Int. Cl.
*G06N 3/04* (2006.01)
*G06N 3/063* (2006.01)
(Continued)

(52) U.S. Cl.
CPC ............... *G06N 3/04* (2013.01); *G06F 5/01* (2013.01); *G06F 7/501* (2013.01); *G06F 7/523* (2013.01);
(Continued)

(58) Field of Classification Search
None
See application file for complete search history.

(56) References Cited

U.S. PATENT DOCUMENTS 4,450,533 A   5/1984  Petit
4,943,931 A   7/1990  Allen
(Continued)

FOREIGN PATENT DOCUMENTS

CA   2019099        12/1990
CA   2002681 A1    5/1991
(Continued)

OTHER PUBLICATIONS

Zhou Balanced Quantization: An Effective and Efficient Approach to Quantized Neural Networks, arXiv, Jun. 2017 (Year: 2017).*
(Continued)

*Primary Examiner* — Brian M Smith
*Assistant Examiner* — Shien Ming Chou
(74) *Attorney, Agent, or Firm* — Zaretsky Group PC; Howard Zaretsky

(57) ABSTRACT

A novel and useful system and method of data driven quantization optimization of weights and input data in an artificial neural network (ANN). The system reduces quantization implications (i.e. error) in a limited resource system by employing the information available in the data actually observed by the system. Data counters in the layers of the network observe the data input thereto. The distribution of the data is used to determine an optimum quantization scheme to apply to the weights, input data, or both. The mechanism is sensitive to the data observed at the input layer of the network. As a result, the network auto-tunes to optimize the instance specific representation of the network. The network becomes customized (i.e. specialized) to the inputs it observes and better fits itself to the subset of the sample space that is applicable to its actual data flow. As a result, nominal process noise is reduced and detection accuracy improves. In addition, the mechanism enables the reduction of the representation space and further reduces the
(Continued)

memory (and energy thereof) needed to represent the network properties.

20 Claims, 17 Drawing Sheets

(51) Int. Cl.
| | |
|---|---|
| G06N 20/00 | (2019.01) |
| G06F 17/10 | (2006.01) |
| G06F 5/01 | (2006.01) |
| G06N 3/08 | (2006.01) |
| G06N 3/02 | (2006.01) |
| G06F 12/02 | (2006.01) |
| G06F 12/06 | (2006.01) |
| G06F 30/30 | (2020.01) |
| G06F 30/27 | (2020.01) |
| G06V 10/40 | (2022.01) |
| G06F 7/501 | (2006.01) |
| G06F 7/523 | (2006.01) |
| G06F 9/50 | (2006.01) |
| G06F 13/16 | (2006.01) |
| G06F 9/30 | (2018.01) |
| G06K 9/62 | (2022.01) |

(52) U.S. Cl.
CPC ........ *G06F 9/30054* (2013.01); *G06F 9/5016* (2013.01); *G06F 9/5027* (2013.01); *G06F 12/02* (2013.01); *G06F 12/0207* (2013.01); *G06F 12/0646* (2013.01); *G06F 12/0692* (2013.01); *G06F 13/1663* (2013.01); *G06F 17/10* (2013.01); *G06F 30/27* (2020.01); *G06F 30/30* (2020.01); *G06K 9/62* (2013.01); *G06N 3/02* (2013.01); *G06N 3/0454* (2013.01); *G06N 3/063* (2013.01); *G06N 3/08* (2013.01); *G06N 3/084* (2013.01); *G06N 20/00* (2019.01); *G06V 10/40* (2022.01); *G06N 3/082* (2013.01); *Y02D 10/00* (2018.01)

(56) References Cited

U.S. PATENT DOCUMENTS

| | | |
|---|---|---|
| 4,979,124 A | 12/1990 | Sachse et al. |
| 4,994,982 A | 2/1991 | Duranton et al. |
| 5,003,490 A | 3/1991 | Castelaz et al. |
| 5,008,833 A | 4/1991 | Agranat et al. |
| 5,014,235 A | 5/1991 | Morton |
| 5,056,037 A | 10/1991 | Eberhardt |
| 5,080,464 A | 1/1992 | Toyoda |
| 5,091,864 A | 2/1992 | Baji et al. |
| 5,148,515 A | 9/1992 | Vassiliadis et al. |
| 5,195,169 A | 3/1993 | Kamiya et al. |
| 5,195,170 A | 3/1993 | Eberhardt |
| 5,257,358 A | 10/1993 | Cohen |
| 5,274,743 A | 12/1993 | Imondi et al. |
| 5,278,945 A | 1/1994 | Basehore et al. |
| 5,293,456 A | 3/1994 | Guez et al. |
| 5,293,459 A | 3/1994 | Duranton et al. |
| 5,297,232 A | 3/1994 | Murphy |
| 5,365,460 A | 11/1994 | Chung |
| 5,367,612 A | 11/1994 | Bozich et al. |
| 5,408,645 A | 4/1995 | Ikeda et al. |
| 5,423,001 A | 6/1995 | Ueda |
| 5,430,830 A | 7/1995 | Frank et al. |
| 5,444,822 A | 8/1995 | Shinohara |
| 5,448,681 A | 9/1995 | Khan |
| 5,450,315 A | 9/1995 | Stefanski |
| 5,465,204 A | 11/1995 | Sekine et al. |
| 5,479,579 A | 12/1995 | Duong et al. |
| 5,485,545 A | 1/1996 | Kojima et al. |
| 5,486,996 A | 1/1996 | Samad et al. |
| 5,493,631 A | 2/1996 | Huang et al. |
| 5,504,839 A | 4/1996 | Mobus |
| 5,519,811 A | 5/1996 | Yoneda et al. |
| 5,521,985 A | 5/1996 | Camp, Jr. et al. |
| 5,533,383 A | 7/1996 | Greene et al. |
| 5,537,513 A | 7/1996 | DeVille |
| 5,583,771 A | 12/1996 | Lynch et al. |
| 5,615,305 A | 3/1997 | Nunally |
| 5,627,943 A | 5/1997 | Yoneda et al. |
| 5,689,622 A | 11/1997 | Higashino et al. |
| 5,704,016 A | 12/1997 | Shigematsu et al. |
| 5,705,956 A | 1/1998 | Neely |
| 5,717,832 A | 2/1998 | Steimle et al. |
| 5,740,325 A | 4/1998 | Wang |
| 5,745,652 A | 4/1998 | Bigus |
| 5,748,849 A | 5/1998 | Gobert |
| 5,796,925 A | 8/1998 | Deville |
| 5,944,841 A | 8/1999 | Christie |
| 5,956,703 A | 9/1999 | Turner et al. |
| 5,978,782 A | 11/1999 | Neely |
| 6,267,298 B1 | 7/2001 | Campbell |
| 6,317,658 B1 | 11/2001 | Vian |
| 6,326,912 B1 | 12/2001 | Fujimori |
| 6,366,236 B1 | 4/2002 | Farmer et al. |
| 6,421,359 B1 | 7/2002 | Bennett et al. |
| 6,434,541 B1 | 8/2002 | Tawel et al. |
| 6,446,238 B1 | 9/2002 | Canestaro et al. |
| 6,493,689 B2 | 12/2002 | Kotoulas et al. |
| 6,523,018 B1 | 2/2003 | Louis et al. |
| 6,529,614 B1 | 3/2003 | Chao et al. |
| 6,539,368 B1 | 3/2003 | Chernikov et al. |
| 6,542,985 B1 | 4/2003 | Johnson et al. |
| 6,567,953 B1 | 5/2003 | Pomerantz |
| 6,578,020 B1 | 6/2003 | Nguyen |
| 6,622,125 B1 | 9/2003 | Cragun et al. |
| 6,629,089 B1 | 9/2003 | Supino |
| 6,665,813 B1 | 12/2003 | Forsman et al. |
| 6,671,832 B1 | 12/2003 | Apisdorf |
| 6,751,529 B1 | 6/2004 | Fouche |
| 6,836,767 B2 | 12/2004 | McBride |
| 6,882,992 B1 | 4/2005 | Werbos |
| 7,069,256 B1 | 6/2006 | Campos |
| 7,082,419 B1 | 7/2006 | Lightowler |
| 7,113,970 B2 | 9/2006 | Chiueh |
| 7,117,045 B2 | 10/2006 | Hittle et al. |
| 7,174,325 B1 | 2/2007 | Ascoli |
| 7,302,619 B1 | 11/2007 | Tompkins et al. |
| 7,308,322 B1 | 12/2007 | Discenzo et al. |
| 7,647,284 B2 | 1/2010 | Prokhorov |
| 8,081,816 B1 | 12/2011 | Irick et al. |
| 8,126,828 B2 | 2/2012 | Snook et al. |
| 8,131,659 B2 | 3/2012 | Xu et al. |
| 8,145,983 B1 | 3/2012 | Chaichanavong |
| 8,321,769 B1 | 11/2012 | Yeo |
| 8,326,782 B2 | 12/2012 | Snook et al. |
| 8,391,306 B2 | 3/2013 | Ito et al. |
| 8,745,466 B2 | 6/2014 | Kaynak |
| 8,892,485 B2 | 11/2014 | Aparin et al. |
| 8,909,576 B2 | 12/2014 | Akopyan et al. |
| 8,996,350 B1 | 3/2015 | Dub |
| 8,996,967 B2 | 3/2015 | Kaynak |
| 9,014,181 B2 | 4/2015 | Lakshman et al. |
| 9,077,491 B2 | 7/2015 | Mar et al. |
| 9,129,220 B2 | 9/2015 | Aparin et al. |
| 9,129,222 B2 | 9/2015 | Aparin |
| 9,153,230 B2 | 10/2015 | Maaninen |
| 9,159,020 B2 | 10/2015 | Alcarez-Icaza Rivera et al. |
| 9,195,656 B2 | 11/2015 | Fructuoso et al. |
| 9,306,965 B1 | 4/2016 | Grossman et al. |
| 9,400,954 B2 | 7/2016 | Modha |
| 9,466,022 B2 | 10/2016 | Alvarez-Icaza Rivera et al. |
| 9,477,925 B2 | 10/2016 | Seide et al. |
| 9,530,092 B2 | 12/2016 | Chatterjee et al. |
| 9,542,642 B2 | 1/2017 | Wood |
| 9,542,643 B2 | 1/2017 | Levin et al. |
| 9,558,444 B2 | 1/2017 | Palmer et al. |
| 9,607,217 B2 | 3/2017 | Cetintas et al. |
| 10,019,470 B2 | 7/2018 | Birdwell et al. |
| 10,073,816 B1 | 9/2018 | Lu et al. |

(56) References Cited

U.S. PATENT DOCUMENTS

| | | |
|---|---|---|
| 10,417,089 B2 | 9/2019 | Oboukhov |
| 10,430,706 B2 | 10/2019 | Henry et al. |
| 10,699,189 B2 | 6/2020 | Lie et al. |
| 10,789,734 B2* | 9/2020 | Pan .................. G06K 9/6262 |
| 10,824,937 B2* | 11/2020 | Davies .................. G06N 3/063 |
| 10,936,569 B1 | 3/2021 | Baskaran et al. |
| 2002/0112204 A1 | 8/2002 | Biskup et al. |
| 2002/0184556 A1 | 12/2002 | Hashemi |
| 2003/0069516 A1 | 4/2003 | Becker et al. |
| 2003/0115537 A1 | 6/2003 | Boyer et al. |
| 2004/0167418 A1 | 8/2004 | Nguyen et al. |
| 2005/0193357 A1 | 9/2005 | Honary et al. |
| 2005/0256420 A1 | 11/2005 | Noman et al. |
| 2006/0015703 A1 | 1/2006 | Ramchandran |
| 2006/0085558 A1 | 4/2006 | Solomon |
| 2006/0167784 A1 | 7/2006 | Hoffberg |
| 2007/0266277 A1 | 11/2007 | Oyamada |
| 2008/0117220 A1 | 5/2008 | Gorchetchnikov et al. |
| 2009/0276666 A1 | 11/2009 | Haley et al. |
| 2010/0100514 A1 | 4/2010 | Raymond et al. |
| 2010/0205399 A1 | 8/2010 | Bean et al. |
| 2010/0313104 A1 | 12/2010 | Bommena et al. |
| 2010/0317420 A1 | 12/2010 | Hoffberg |
| 2011/0041013 A1 | 2/2011 | Ingimundarson |
| 2012/0179898 A1 | 7/2012 | Betouin et al. |
| 2013/0079842 A1 | 3/2013 | Mokelke et al. |
| 2013/0254892 A1 | 9/2013 | Kaufman |
| 2014/0032457 A1 | 1/2014 | Palmer et al. |
| 2014/0156576 A1 | 6/2014 | Nugent |
| 2014/0344203 A1 | 11/2014 | Ahn |
| 2015/0026104 A1 | 1/2015 | Tambos |
| 2015/0081753 A1 | 3/2015 | Srinivasan |
| 2015/0106311 A1 | 4/2015 | Birdwell et al. |
| 2015/0106317 A1 | 4/2015 | Rangan et al. |
| 2015/0134580 A1 | 5/2015 | Wilson |
| 2015/0170021 A1 | 6/2015 | Lupon et al. |
| 2015/0212861 A1 | 7/2015 | Canoy et al. |
| 2015/0269480 A1 | 9/2015 | Levin et al. |
| 2015/0324690 A1 | 11/2015 | Chilimbi et al. |
| 2015/0324691 A1 | 11/2015 | Dropps et al. |
| 2015/0324692 A1 | 11/2015 | Ritchey et al. |
| 2016/0086077 A1 | 3/2016 | Akopyan et al. |
| 2016/0179434 A1 | 6/2016 | Herrero et al. |
| 2016/0232442 A1 | 8/2016 | Fan et al. |
| 2016/0275398 A1 | 9/2016 | Corvinelli et al. |
| 2016/0321537 A1 | 11/2016 | Akopyan et al. |
| 2016/0328646 A1* | 11/2016 | Lin .................. G06V 10/454 |
| 2016/0335119 A1 | 11/2016 | Merill et al. |
| 2016/0335534 A1 | 11/2016 | Nere et al. |
| 2017/0011288 A1 | 1/2017 | Brothers et al. |
| 2017/0017876 A1 | 1/2017 | Modha |
| 2017/0024644 A1 | 1/2017 | Van Der Made et al. |
| 2017/0090929 A1 | 3/2017 | Muttik et al. |
| 2017/0091614 A1 | 3/2017 | Amir et al. |
| 2017/0093526 A1 | 3/2017 | Mula et al. |
| 2017/0103313 A1 | 4/2017 | Ross et al. |
| 2017/0110093 A1 | 4/2017 | Stein et al. |
| 2017/0206437 A1 | 7/2017 | Hachiya et al. |
| 2017/0330509 A1 | 11/2017 | Cok et al. |
| 2017/0345181 A1 | 11/2017 | Yu et al. |
| 2018/0018558 A1 | 1/2018 | Lee et al. |
| 2018/0189231 A1 | 7/2018 | Fleming |
| 2018/0232617 A1 | 8/2018 | Rozen et al. |
| 2018/0260220 A1 | 9/2018 | Lacy et al. |
| 2018/0322382 A1 | 11/2018 | Mellempudi et al. |
| 2018/0336462 A1 | 11/2018 | Brothers |
| 2018/0375729 A1 | 12/2018 | Tzoreff |
| 2019/0079729 A1 | 3/2019 | Aimone |
| 2019/0158223 A1 | 5/2019 | Carlough et al. |
| 2019/0197350 A1 | 6/2019 | Park |
| 2019/0373588 A1 | 12/2019 | Bae |
| 2020/0154482 A1 | 5/2020 | Ahn |
| 2020/0193297 A1 | 6/2020 | Verhoef |
| 2020/0202198 A1 | 6/2020 | Lee et al. |
| 2020/0024496 A1 | 7/2020 | Bhorkar |
| 2020/0285950 A1 | 9/2020 | Baum et al. |
| 2020/0285997 A1 | 9/2020 | Bhattacharyya |
| 2020/0322135 A1 | 10/2020 | Kupwade Patil |
| 2020/0379841 A1 | 12/2020 | Cassidy et al. |
| 2021/0053574 A1 | 2/2021 | Bielby et al. |
| 2021/0073127 A1 | 3/2021 | Bielby et al. |
| 2021/0132678 A1 | 5/2021 | An |
| 2021/0158169 A1 | 5/2021 | Kim |

FOREIGN PATENT DOCUMENTS

| | | |
|---|---|---|
| CA | 2383318 A1 | 10/2003 |
| CA | 2927171 A1 | 7/2016 |
| CN | 101452258 | 6/2009 |
| CN | 101493677 | 7/2009 |
| CN | 101809597 | 8/2010 |
| CN | 201927073 | 8/2011 |
| CN | 101882238 | 2/2012 |
| CN | 102490120 | 6/2012 |
| CN | 103778468 | 5/2014 |
| CN | 104107507 | 10/2014 |
| CN | 104459064 | 3/2015 |
| CN | 104493826 | 4/2015 |
| CN | 104899641 | 9/2015 |
| CN | 105184366 A | 12/2015 |
| CN | 105260776 | 1/2016 |
| CN | 105311750 | 2/2016 |
| CN | 105653790 | 6/2016 |
| CN | 105676649 | 6/2016 |
| CN | 105678379 | 6/2016 |
| CN | 105844330 | 8/2016 |
| CN | 105930902 | 9/2016 |
| CN | 106022468 | 10/2016 |
| CN | 106355246 | 1/2017 |
| CN | 106447034 | 2/2017 |
| CN | 106503796 | 3/2017 |
| CN | 106529670 | 3/2017 |
| DE | 4310279 A | 10/1993 |
| DE | 19718224 | 11/1997 |
| EP | 0388806 A2 | 9/1990 |
| EP | 568146 B1 | 11/1993 |
| EP | 575716 A1 | 12/1993 |
| EP | 411761 B1 | 4/1996 |
| EP | 370543 B1 | 1/1997 |
| EP | 465241 B1 | 11/1998 |
| EP | 525543 B1 | 1/1999 |
| EP | 2825974 | 1/2015 |
| EP | 3035249 | 6/2016 |
| EP | 3276540 A2 * | 1/2018 ............ G06F 7/523 |
| FR | 2724029 B1 | 12/1997 |
| FR | 2780919 | 1/2000 |
| GB | 2245401 | 1/1992 |
| GB | 2351885 | 1/2001 |
| JP | H02157832 | 6/1990 |
| JP | H02206867 | 8/1990 |
| JP | H02207369 | 8/1990 |
| JP | H02267660 | 11/1990 |
| JP | H02292602 | 12/1990 |
| JP | 3100857 | 4/1991 |
| JP | H03276137 | 12/1991 |
| JP | H04040581 | 2/1992 |
| JP | H04113481 | 4/1992 |
| JP | H04148212 | 5/1992 |
| JP | H04182769 | 6/1992 |
| JP | H04237388 | 8/1992 |
| JP | H04328691 | 11/1992 |
| JP | H04336370 | 11/1992 |
| JP | H04344970 | 12/1992 |
| JP | H0520294 A | 1/1993 |
| JP | H05067064 | 3/1993 |
| JP | H0581227 | 4/1993 |
| JP | H05128284 | 5/1993 |
| JP | H05128285 | 5/1993 |
| JP | H05159087 | 6/1993 |
| JP | H05165800 | 7/1993 |
| JP | H05165987 | 7/1993 |
| JP | H05181547 | 7/1993 |
| JP | H05197701 | 8/1993 |
| JP | H05282272 | 10/1993 |

(56) References Cited

FOREIGN PATENT DOCUMENTS

| | | |
|---|---|---|
| JP | 5346914 | 12/1993 |
| JP | H05334278 | 12/1993 |
| JP | H0619868 | 1/1994 |
| JP | H06076092 | 3/1994 |
| JP | H06161586 | 6/1994 |
| JP | H07005904 | 1/1995 |
| JP | 7105165 | 4/1995 |
| JP | H07160796 | 6/1995 |
| JP | H07191951 | 7/1995 |
| JP | H07302292 | 11/1995 |
| JP | H08161282 | 6/1996 |
| JP | H09026948 | 1/1997 |
| JP | 2000322400 | 11/2000 |
| JP | 2001034735 | 2/2001 |
| JP | 3177996 | 6/2001 |
| JP | 2006154992 | 6/2006 |
| JP | 4264664 | 5/2009 |
| JP | 2009288908 | 12/2009 |
| JP | 2015195011 | 11/2015 |
| JP | 2016153984 | 8/2016 |
| JP | 2016219011 | 12/2016 |
| KR | 2001095960 | 11/2001 |
| KR | 367715 B1 | 1/2003 |
| KR | 2005042871 | 5/2005 |
| KR | 919572 B1 | 10/2009 |
| RU | 2057363 | 3/1996 |
| RU | 2473126 | 1/2013 |
| RU | 2602973 | 11/2016 |
| UA | 96148 C2 | 10/2011 |
| WO | WO 1991019267 A1 | 12/1991 |
| WO | WO 1993/023814 A1 | 11/1993 |
| WO | WO 1996041277 A1 | 12/1996 |
| WO | WO 2005/051189 A2 | 6/2005 |
| WO | WO 2007/033101 A2 | 3/2007 |
| WO | WO 2012/006468 A1 | 1/2012 |
| WO | WO 2015/157013 A1 | 10/2015 |
| WO | WO 2015/193531 A1 | 12/2015 |
| WO | WO 2016/099779 A1 | 6/2016 |
| WO | WO 2016/186811 A1 | 11/2016 |
| WO | WO 2018/126270 A1 | 7/2018 |

OTHER PUBLICATIONS

Lin, Fixed Point Quantization of Deep Convolutional Networks, arXiv, Jun. 2016 (Year: 2016).*

Lee, Energy-Efficient Hybrid Stochastic—Binary Neural Networks for Near-Sensor computing, Design, Automation & Test in Europe Conference & Exhibition, Mar. 2017 (Year: 2017).*

Sze, Efficient Processing of Deep Neural Network: a Tutorial and Survey, arXiv, Mar. 2017 (Year: 2017).*

Yihua Liao: Neural Networks in Hardware: A Survey (undated).

Zhu et al., "Flow-Guided Feature Aggregation for Video Object Detection", Arxiv Technology Report, arXiv:1703.10025v2 [cs.CV], Aug. 2017.

ISR/WO dated Jun. 24, 2018; issued in connection with PCT/IL2018/050392.

ISR/WO dated Jul. 10, 2018; issued in connection with PCT/IL2018/050393.

ISR/WO dated Jul. 12, 2018; issued in connection with PCT/IL2018/050394.

ISR/WO dated Jul. 11, 2018; issued in connection with PCT/IL2018/050395.

ISR/WO dated Jul. 15, 2018; issued in connection with PCT/IL2018/050396.

Khan M et al, SpiNNaker: Mapping neural networks onto a massively-parallel chip multiprocessor, Neural Networks, 2008, pp. 2849-2856.

Carillo et al, Hierarchical network-on-chip and traffic ompression . . . , 2012 IEEE, p. 83-90.

Amir et al., "Cognitive Computing Programming Paradigm: A Corelet Language for Composing Networks ofNeurosynaptic Cores", Aug. 4-9, 2013, The 2013 International Joint Conference on Neural Networks (IJCNN), IEEE.

George et al.,MicroPython 1.14 [Online}, Aug. 2015 [retrived on Mar. 16, 2021], Retrieved from the Internet:,URL http://docs.micropython.org/en/latest/pyboard/tutorial/assembler.html.

M'zah et al., "Deterministic Microcode Machine Generation", 2017 IEEE Conference on Dependable and Secure Computing, 2017, pp. 370-376, doi: 10.1109/DESEC.2017.8073858.

Pattnaik et al., "Scheduling Techniques for GPU Architectures with Processing-In_Memory Capabilities", Sep. 11-15, 2016, IEEE, p. 31-44.

Principe et al., "An Analysis of the Gamma Memory in Dynamic Neural Networks", IEEE Transactions on Neural Networks, vol. 5, No. 2, pp. 331-337, Mar. 1994.

Kumpati S. Narendra et al., "Identification and Control of Dynamical Systyems Using Neural Networks", IEEE Transactions on Neural Networks, vol. 1, No. 1, pp. 4-27, Mar. 1990.

Campolucci et al., "On-Line Learning Algorithms for Locally Recurrent Neural Networks", IEEE Transactions on Neural Networks, vol. 1 , No. 2, pp. 253-271, Mar. 1999.

* cited by examiner

DATA DRIVEN QUANTIZATION OPTIMIZATION OF WEIGHTS AND INPUT DATA IN AN ARTIFICIAL NEURAL NETWORK

REFERENCE TO PRIORITY APPLICATIONS

This application claims the benefit of U.S. Provisional Application No. 62/481,492, filed Apr. 4, 2017, entitled "Multi-Layer Artificial Neural Network Computation Engine and Microarchitecture," and U.S. Provisional Application No. 62/531,372, filed Jul. 12, 2017, entitled "Multi-Layer Artificial Neural Network Computation Engine and Microarchitecture," both of which are incorporated herein by reference in their entirety.

FIELD OF THE DISCLOSURE

The subject matter disclosed herein relates to the field of neural networks and more particularly relates to a system and method of data driven quantization optimization of weights and input data in an artificial neural network (ANN).

BACKGROUND OF THE INVENTION

Artificial neural networks (ANNs) are computing systems inspired by the biological neural networks that constitute animal brains. Such systems learn, i.e. progressively improve performance, to do tasks by considering examples, generally without task-specific programming. For example, in image recognition, they might learn to identify images that contain cats by analyzing example images that have been manually labeled as "cat" or "not cat" and using the analytic results to identify cats in other images. They have found most use in applications difficult to express in a traditional computer algorithm using rule-based programming.

An ANN is based on a collection of connected units called artificial neurons, analogous to axons in a biological brain. Each connection or synapse between neurons can transmit a signal to another neuron. The receiving or postsynaptic neuron can process the signals and then signal downstream neurons connected to it. Neurons may have state, generally represented by real numbers, typically between 0 and 1. Neurons and synapses may also have a weight that varies as learning proceeds, which can increase or decrease the strength of the signal that it sends downstream. Further, they may have a threshold such that only if the aggregate signal is below or above that level is the downstream signal sent.

Typically, neurons are organized in layers. Different layers may perform different kinds of transformations on their inputs. Signals travel from the first, i.e. input, to the last, i.e. output, layer, possibly after traversing the layers multiple times.

The original goal of the neural network approach was to solve problems in the same way that a human brain would. Over time, attention focused on matching specific mental abilities, leading to deviations from biology such as backpropagation, or passing information in the reverse direction and adjusting the network to reflect that information.

The components of an artificial neural network include (1) neurons having an activation threshold; (2) connections and weights for transferring the output of a neuron; (3) a propagation function to compute the input to a neuron from the output of predecessor neurons; and (4) a learning rule which is an algorithm that modifies the parameters of the neural network in order for a given input to produce a desired outcome which typically amounts to modifying the weights and thresholds.

Given a specific task to solve, and a class of functions F, learning entails using a set of observations to find the function that which solves the task in some optimal sense. A cost function C is defined such that, for the optimal solution no other solution has a cost less than the cost of the optimal solution).

The cost function C is a measure of how far away a particular solution is from an optimal solution to the problem to be solved. Learning algorithms search through the solution space to find a function that has the smallest possible cost.

A neural network can be trained using backpropagation which is a method to calculate the gradient of the loss function with respect to the weights in an ANN. The weight updates of backpropagation can be done via well-known stochastic gradient descent techniques. Note that the choice of the cost function depends on factors such as the learning type (e.g., supervised, unsupervised, reinforcement) and the activation function.

There are three major learning paradigms and each corresponds to a particular learning task: supervised learning, unsupervised learning, and reinforcement learning. Supervised learning uses a set of example pairs and the goal is to find a function in the allowed class of functions that matches the examples. A commonly used cost is the mean-squared error, which tries to minimize the average squared error between the network's output and the target value over all example pairs. Minimizing this cost using gradient descent for the class of neural networks called multilayer perceptrons (MLP), produces the backpropagation algorithm for training neural networks. Examples of supervised learning include pattern recognition, i.e. classification, and regression, i.e. function approximation.

In unsupervised learning, some data is given and the cost function to be minimized, that can be any function of the data and the network's output. The cost function is dependent on the task (i.e. the model domain) and any a priori assumptions (i.e. the implicit properties of the model, its parameters, and the observed variables). Tasks that fall within the paradigm of unsupervised learning are in general estimation problems; the applications include clustering, the estimation of statistical distributions, compression, and filtering.

In reinforcement learning, data is usually not provided, but generated by an agent's interactions with the environment. At each point in time, the agent performs an action and the environment generates an observation and an instantaneous cost according to some typically unknown dynamics. The aim is to discover a policy for selecting actions that minimizes some measure of a long-term cost, e.g., the expected cumulative cost. The environment's dynamics and the long-term cost for each policy are usually unknown, but can be estimated.

Today, a common application for neural networks is in the analysis of video streams, i.e. machine vision. Examples include industrial factories where machine vision is used on the assembly line in the manufacture of goods, autonomous vehicles where machine vision is used to detect objects in the path of and surrounding the vehicle, etc.

Artificial Neural Network (ANN) have an inherent structure that greatly relies on a set of parameters that are attributed to the so-called 'network model'. These parameters are often called 'weights' of the network due to their tendency to operate as a scaling factor for other intermediate values as they propagate along the network. The process for determining the values of the weights is called training as described supra. Once training is complete, the network settles into a steady state and can now be used with new (i.e. unknown) data to extract information. This stage is referred to as the 'inference' stage.

During inference, one can observe the resultant set of parameters, namely the weights, and manipulate them to yield better performance (i.e. representation). Methods for pruning and quantizing weights are known. These methods, however, are applied only on the trained model before moving to the inference stage. This approach does yield better execution performance. It does not, however, fully explore and exploit the potential of modifying the weights. In addition, existing solutions apply quantization of weights only after training once the weights of the ANN have converged to a satisfactory level.

SUMMARY OF THE INVENTION

The present invention is a system and method of data driven quantization optimization of weights and input data in an artificial neural network (ANN). The system reduces quantization implications (i.e. error) in a limited resource system by exploiting the information available in the data actually observed by the system. Data counters in the layers of the network observe the data input thereto. The distribution of the data is used to determine an optimum quantization scheme to apply to the weights, input data, or both. The mechanism is sensitive to the data observed at the input layer of the network. As a result, the network auto-tunes to optimize the instance specific representation of the network. The network becomes customized (i.e. specialized) to the inputs it observes and better fits itself to the subset of the sample space that is applicable to its actual data flow. As a result, nominal process noise is reduced and detection accuracy improves. In addition, the mechanism enables the reduction of the representation space and further reduces the memory (and energy thereof) needed to represent the network properties. The system operates at the core of resource constrained ANN devices. When transferring weights from a trained network to the device, the quantization scheme of the present invention aids in preserving accuracy while meeting available device resources.

Note that throughout this document, the term distribution is meant to refer to a histogram or any other statistical measure of data arrangement or disposition.

There is thus provided in accordance with the invention, a method of optimizing quantization in an artificial neural network (ANN), comprising observing data in at least one layer in the artificial neural network during inference mode of operation thereof, based on the observation, determining a quantization level to apply, and applying the quantization level to the at least one layer.

There is also provided in accordance with the invention, a method of optimizing quantization in an artificial neural network (ANN), comprising determining a distribution of input data in one or more layers in the artificial neural network, based on the observed distribution of the input data, determining whether to quantize weights, input data, or both weights and input data within the one or more layers, and applying quantization to the weights, input data, or both the weights and input data within the one or more layers.

There is further provided in accordance with the invention, a method of optimizing quantization in an artificial neural network (ANN), comprising determining a distribution of input data in a layer of the artificial neural network, and based on the observed distribution of the input data, dynamically determining and applying quantization to weights within the layer.

This, additional, and/or other aspects and/or advantages of the embodiments of the present invention are set forth in the detailed description which follows; possibly inferable from the detailed description; and/or learnable by practice of the embodiments of the present invention.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
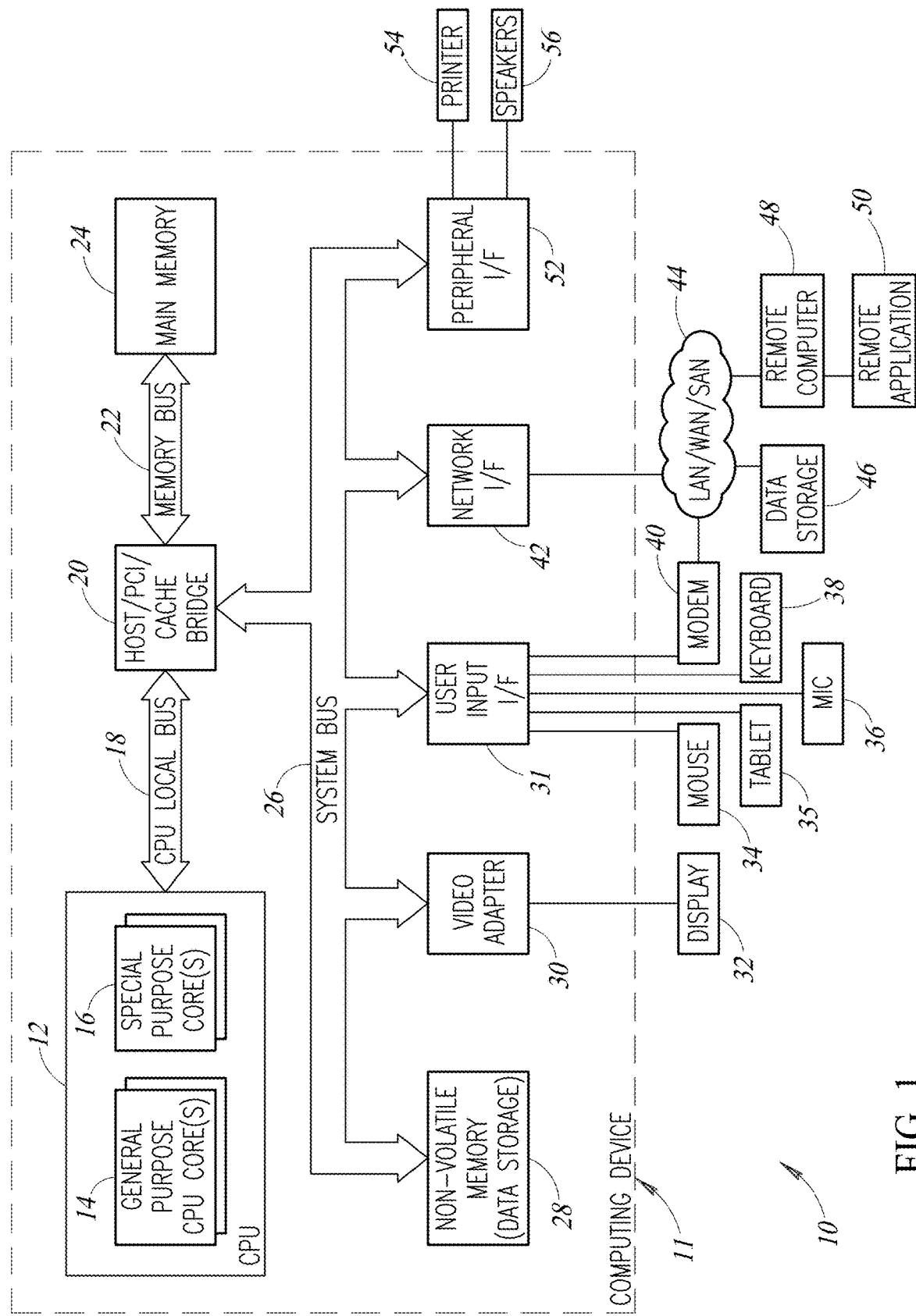
FIG. 1 is a block diagram illustrating an example computer processing system adapted to implement one or more portions of the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain or store the program for use by or in connection with the instruction execution system, apparatus, or device.

Computer program code for carrying out operations of the present invention may be written in any combination of one or more programming languages, including an object-oriented programming language such as Java, Smalltalk, C++, C# or the like, conventional procedural programming languages, such as the "C" programming language, and functional programming languages such as Prolog and Lisp, machine code, assembler or any other suitable programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network using any type of network protocol, including for example a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

In addition, the invention is operational in systems incorporating video and still cameras, sensors, etc. such as found in automated factories, autonomous vehicles, in mobile devices such as tablets and smartphones, smart meters installed in the power grid and control systems for robot networks. In general, any computation device that can host an agent can be used to implement the present invention.

A block diagram illustrating an example computer processing system adapted to implement one or more portions of the present invention is shown in FIG. 1. The exemplary computer processing system, generally referenced 10, for implementing the invention comprises a general-purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, GPU, and neural network optimized core). The one or more general purpose cores execute general purpose opcodes while the special purpose cores execute functions specific to their purpose. The CPU 12 is coupled through the CPU local bus 18 to a host/PCI/cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 20. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, non-volatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Figure 2:
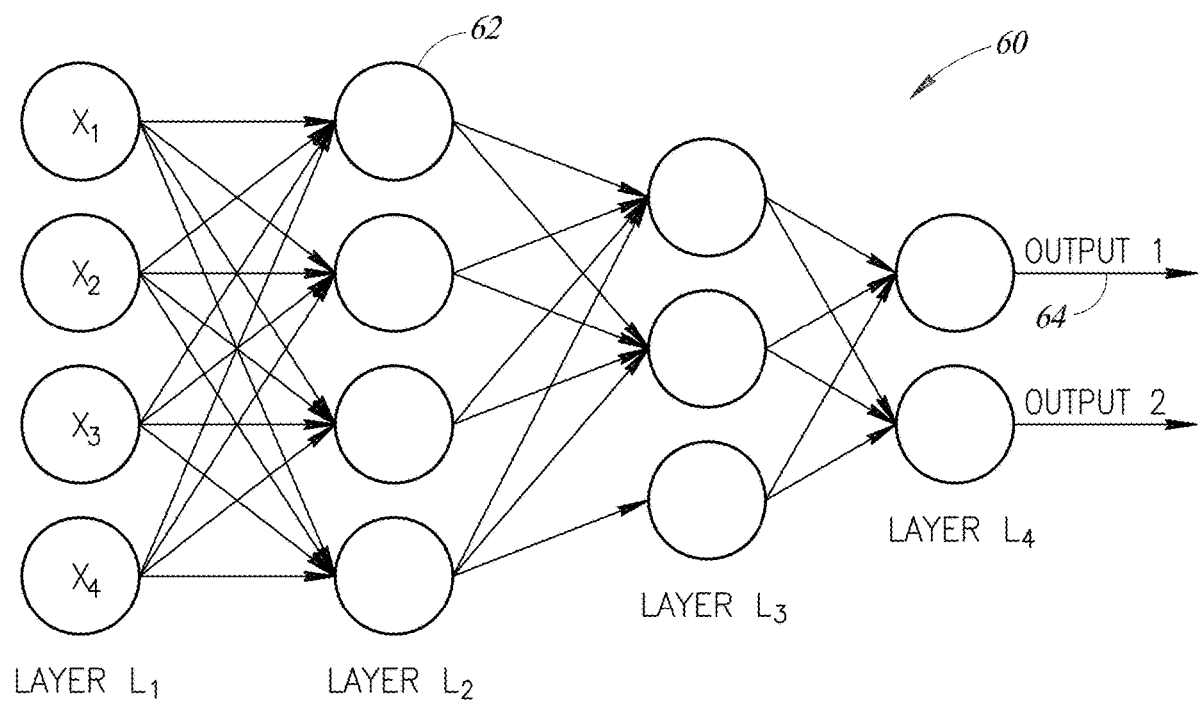
FIG. 2 is a diagram illustrating an example artificial neural network (ANN)

A diagram illustrating an example artificial neural network (ANN) is shown in FIG. 2. The example ANN, generally referenced 60, comprises a plurality of layers including layers $L_1$, $L_2$, $L_4$, and $L_4$. During inference mode of operation, the ANN receives input values x(t) ($X_1$, $X_2$, $X_3$, and $X_4$) and generates an output vector y(t) 64 (i.e. inferences), namely $OUTPUT_1$ and $OUTPUT_2$.

During inference, one can observe the resultant set of parameters, namely the weights, and manipulate them to yield better performance (i.e. representation). Methods for pruning and quantizing weights are well-known. These known methods, however, are applied only on the trained model of the ANN before moving to the inference stage. This approach does yield better execution performance. It does not, however, fully explore and exploit the potential of modifying the weights.

In accordance with the present invention, the weights are modified dynamically 'on the fly' to extract further performance improvements based on the specific data presented to the network. Performance can be improved due to the fact that typically the infrastructure that runs the inference stage is sensitive to dynamic changes in its network representation. Further, performing instance-specific adaptations in the ANN results in readjustments of weights per instance as a function of the specific data samples the ANN sees.

Unlike prior art techniques, the mechanism of the present invention is sensitive to the data observed at the input layer of the network. As a result, the mechanism functions to auto-tune the network to optimize the instance specific representation of the network. This provides the advantages that the network becomes customized (i.e. specialized) to the inputs it observes and better fits itself to the subset of the sample space that is applicable to its actual data flow. As a result, nominal process noise is reduced and detection accuracy improves. Another advantage is that the mechanism enables the reduction of the representation space and further reduces the memory (and energy thereof) needed to represent the network properties. In particular, the invention optimizes the quantization applied in the ANN.

Regarding quantization, the following discussion aids in understanding the operation and benefits of the present invention. A source of 'information' can be expressed in many ways. Information is defined as anything that can be expressed digitally. Each way of representing information has an associated 'efficiency' that can usually be measured considering the 'energy' invested in representing the information. The more redundancy there is the less efficient is the representation in terms of energy.

Typically, two sources of redundancy include (1) the source information distribution (inherent to the nature of the source), and (2) the path through which this information needs to travel and the impact this path imposes on the data (i.e. referred to as 'channel noise'). The process of quantization refers to a representation of the source information differently such that less data is needed to 'properly' represent the source information. During this process, 'distortion' may be added to the source. It is desired that this added distortion or noise will not impact the representation to the extent that the needed information cannot be extracted.

There are two key factors when determining how much quantization to apply. The first factor is the distribution of the data source. Lacking a priori knowledge, uniformity is assumed and thus each piece of information is equally important. If, however, the true distribution was known, more compact representation could be assigned to the messages more likely to occur thereby resulting in improved efficiency.

The second factor is the marginal error which refers to how much 'slack' is available before confusion with other symbols occurs. For example, consider three level black-gray-white images from a visual source that generates an 8-bit gray level per pixel. For three levels, two bits are sufficient for a three level result. Thus, we can discard six bits without any loss and an input image of X bytes can now be represented using $2/8 = 1/4$ the number of bytes or X/4.

If, however, we observe the distribution of black-gray-white pixels even higher efficiency can be obtained. Consider images containing written text where the majority of the image is white, e.g., 70% white, 15% gray, 15% black. In this case pixels can be represented in binary as follows: white as '1', gray as '00', and black as '01'. The memory requirements for pixels in the image are then $(0.7 \times 1 + 0.3 \times 2)/8 = 1/6$ the number of bytes or X/6. Thus, the more knowledge about the source distribution can be leveraged for improved efficiency.

In artificial neural networks, source information is represented by both the internal weights and the data (i.e. input data to each layer). Weights are determined during training after which they are static. At this point the weights can be quantized. The quantization, however, is limited to being uniform across all the possible values of the weights. This is because the quantization process has no a priori knowledge of the input distribution and is thus forced to assume uniformity.

In accordance with the present invention, the redundancy in the input data is leveraged to allow additional quantization of the input data, internal weights, or both. In one embodiment, knowledge of the input data is leveraged for optimizing data quantization. In this case the mechanism determines that some data elements consistently contribute little to the network output. This may occur, for example, if the values at the edges of the image are irrelevant to determining the object in the frame.

In another embodiment, knowledge of the input data is leveraged for optimizing weight quantization. Once the distribution of the input data is known, weights that multiply data of less importance can be quantized more heavily. In another embodiment, knowledge of the input data is leveraged for optimizing both data and weight quantization.

Figure 3:
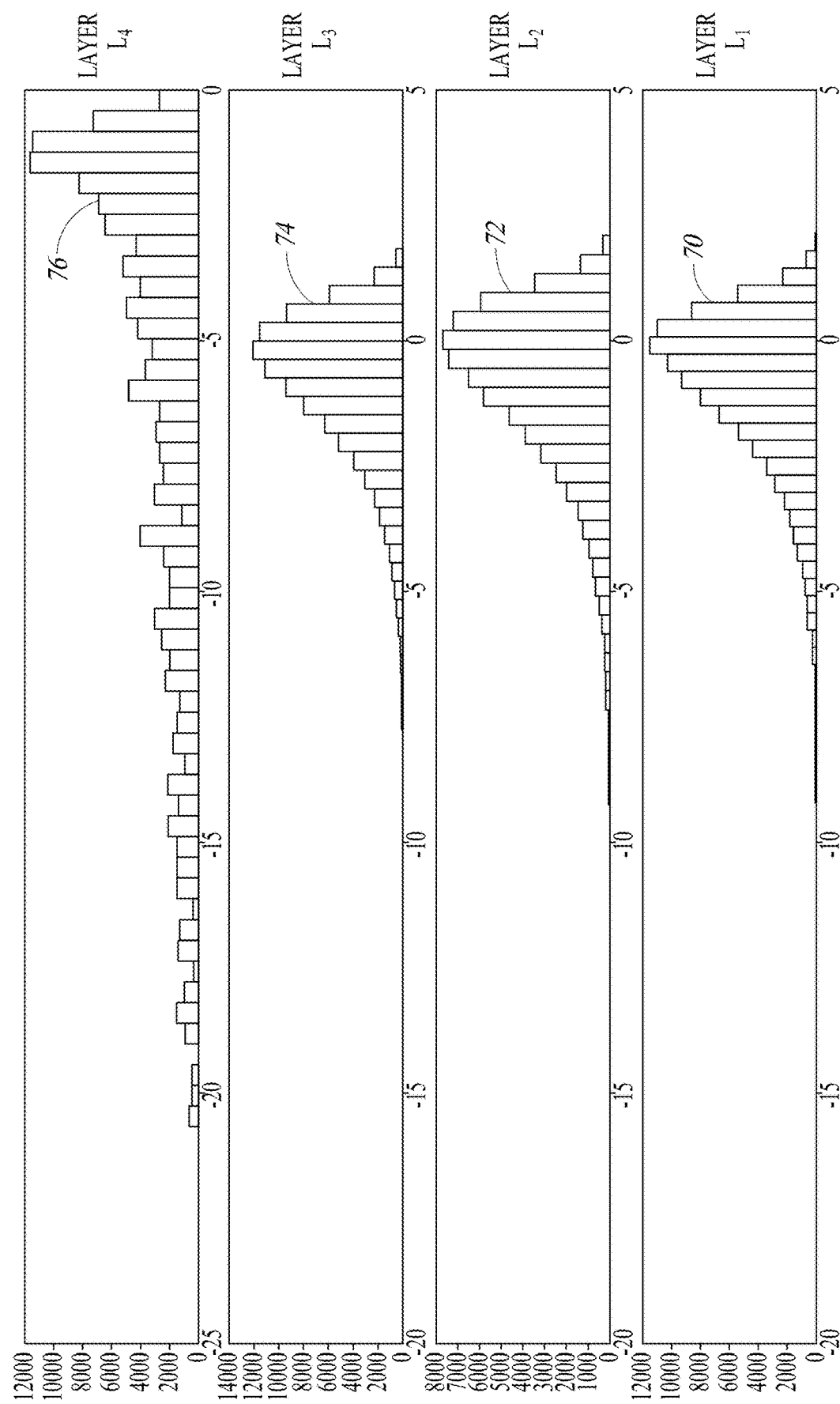
FIG. 3 is a diagram illustrating a first example distribution of input data.
Figure 4A:
FIGS. 4A, 4B, 4C, 4D, and 4E are diagrams illustrating a second example distribution of input data.
Figure 4B:
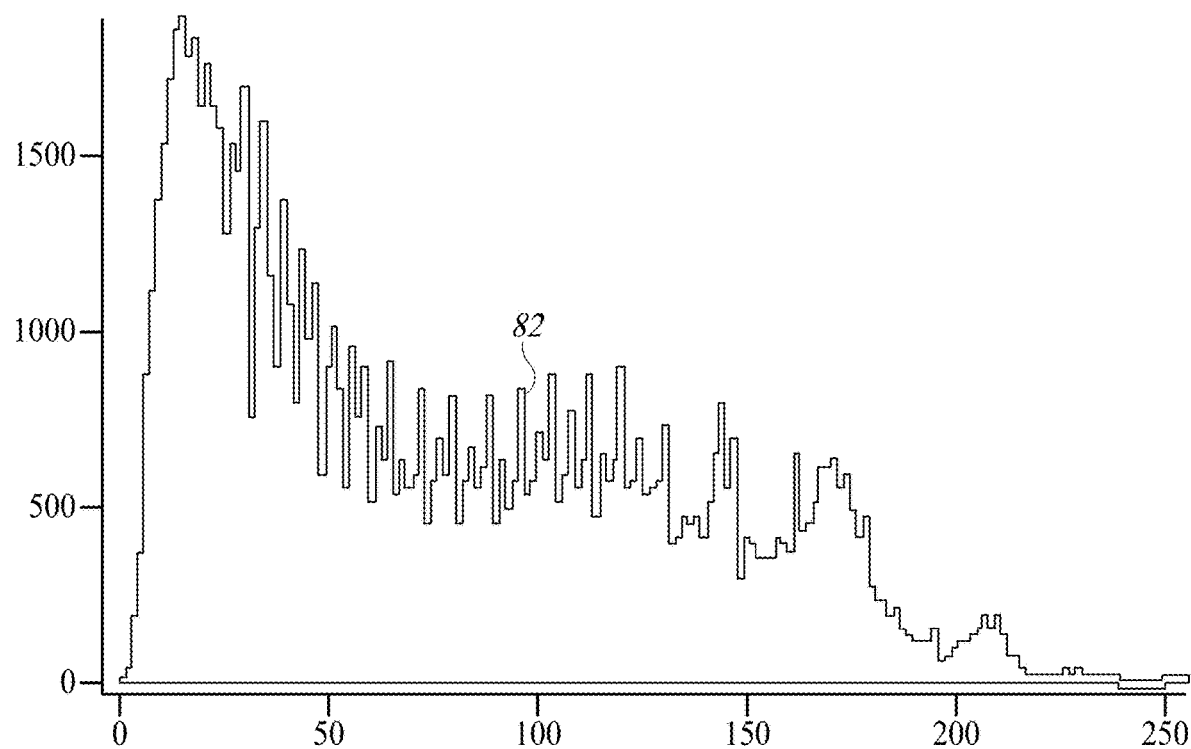
Figure 4C:
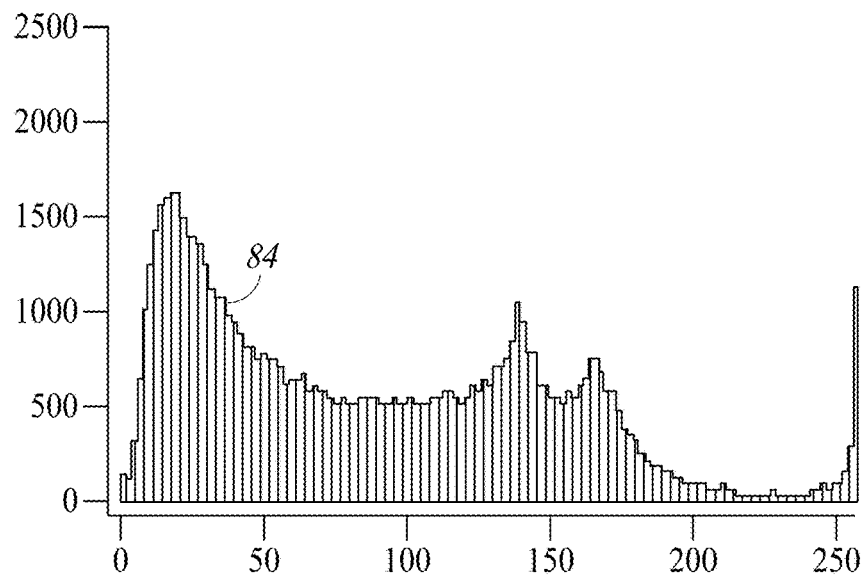
Figure 4D:
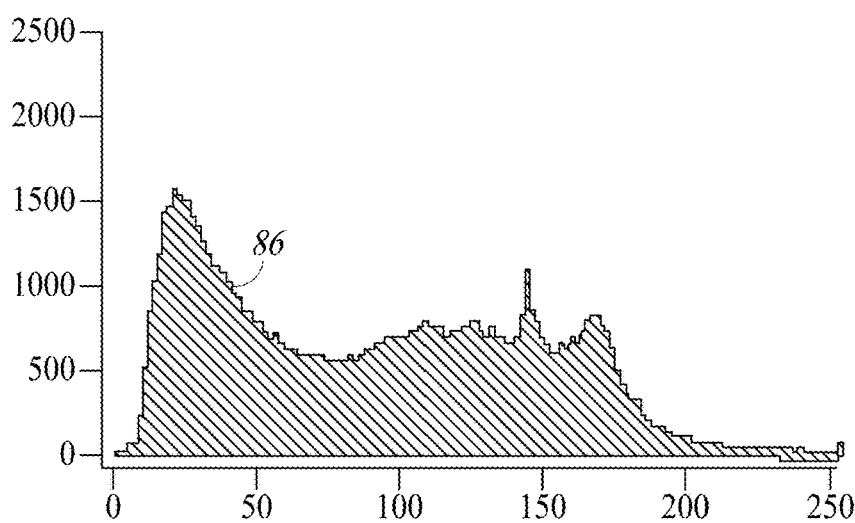
Figure 4E:
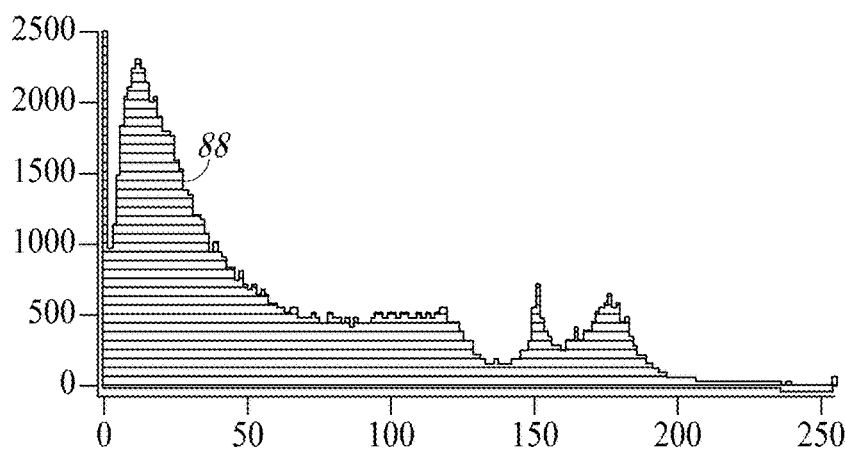

Several examples of the distribution of input data to aid in illustrating the operation of the invention will now be presented. A diagram illustrating a first example distribution of input data from a neural network is shown in FIG. 3. Histograms 70, 72, 74, 78 from four layers $L_1$, $L_2$, $L_3$, $L_4$, respectively, of a neural network in the middle of training a network for MNIST are shown. Each layer represents the histogram of hidden states. The x-axis represents the exponent of all possible data values. Note that the distributions (1) are far from being uniform thus implying quantization has high potential, and (2) vary from layer to layer suggesting a dependence on the statistics of weights and data.

Diagrams illustrating a second example distribution of input data are shown in FIGS. 4A, 4B, 4C, 4D, and 4E. Histograms 82, 84, 86, 88 represent luminance, red, green, blue, channel components, respectively, of image 80. Note that these distributions are also quite clearly not uniform and vary from channel to channel.

Figure 5:
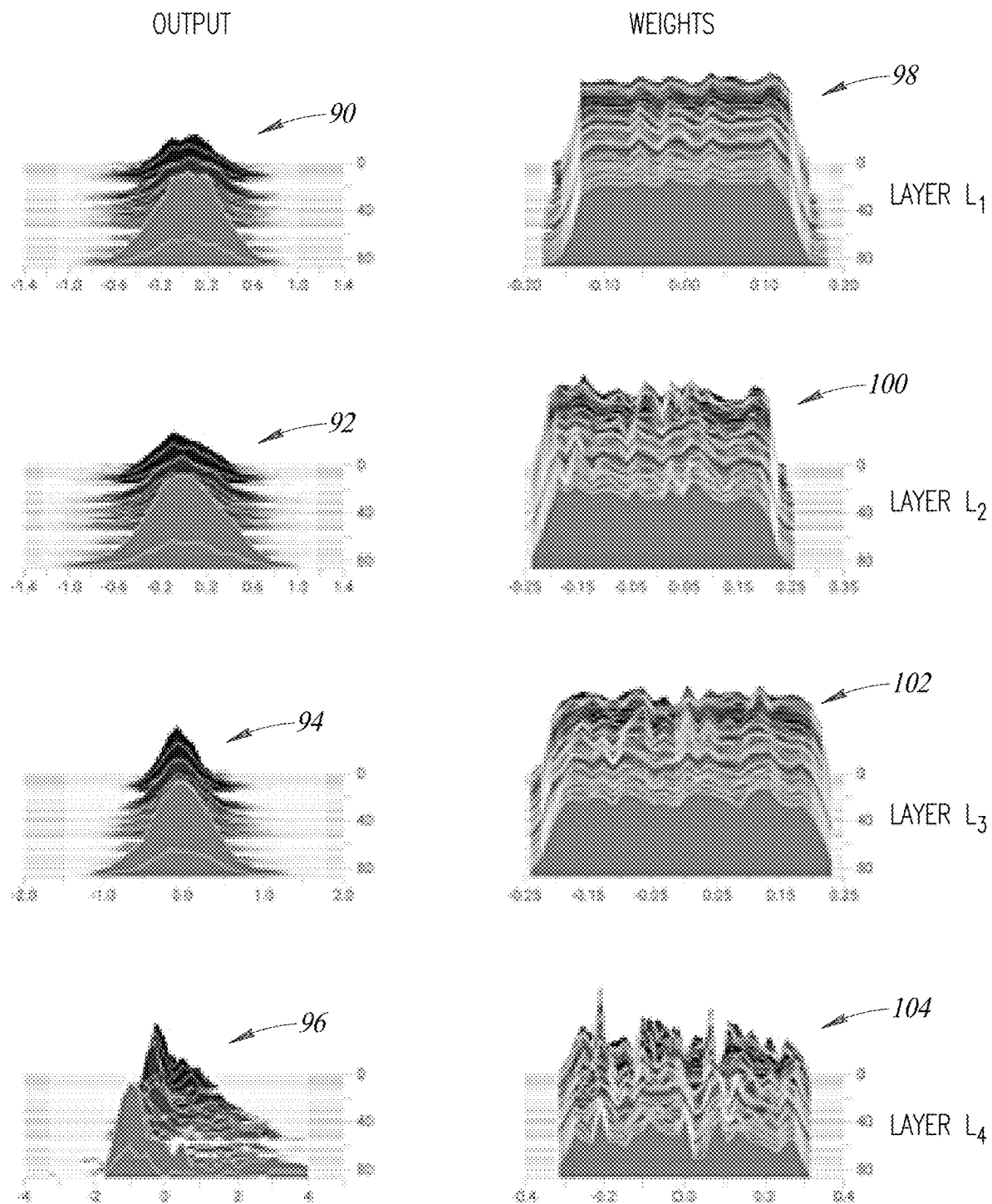
FIG. 5 is a diagram illustrating a third example distribution of input data.

A diagram illustrating a third example distribution of input data is shown in FIG. 5. Output histograms (before activation) 90, 92, 94, 96 and weight histograms 98, 100, 102, 104 for four layers $L_1$, $L_2$, $L_3$, $L_4$, respectively, are from the Google analysis tool Tensorboard. The x-axis represents the range of values, the y-axis each neuron, and the z-axis the distribution value. Note that (1) weights are distributed differently among the layers, e.g., weights for $L_1$ versus $L_4$, and (2) outputs are clearly distributed differently than the weights of the same layer. Note that since the only other factor shaping the output apart from the weights is the data, incorporating data in the quantization process is valuable.

Figure 6:
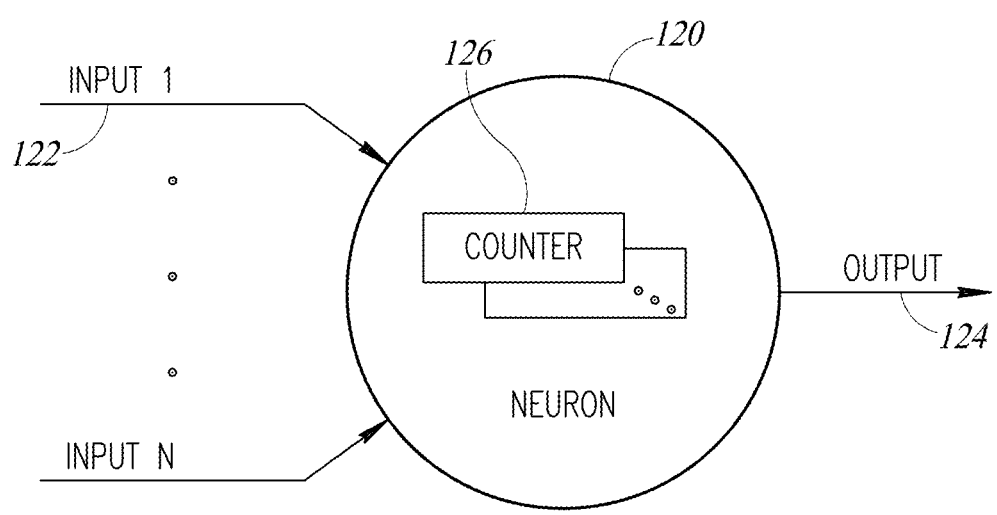
FIG. 6 is a diagram illustrating a neuron incorporating a plurality of data counters.

Note that the mechanism of the present invention can be applied to almost any ANN. One requirement is to generate the distribution of the input data. This can be achieved by incorporating one or more counters in a neuron. A diagram illustrating a neuron incorporating a plurality of data counters is shown in FIG. 6. A counter 126 in each neuron 120 is associated with each possible value bin. In one embodiment, the neuron maintains the statistics for the input data 122 that is sees as well as the output data 124 that is generates.

Consider an ANN having one or more layers. The common notation for a layer output is expressed as follows:

$$y = \sigma(Wx + B) \qquad (1)$$

Where $\sigma$ is the activation function, W are the weights, x is the input, B is the bias, and y is the output.

We denote:

$$\varepsilon^W = |\sigma(W \cdot x + B) - \sigma(W^Q \cdot x + B^Q)| \qquad (2)$$

$$\varepsilon^x = |\sigma(W \cdot x + B) - \sigma(W \cdot x^Q + B)| \qquad (3)$$

$$\varepsilon^T = |\sigma(W \cdot x + B) - \sigma(W^Q \cdot x^Q + B^Q)| \qquad (4)$$

where $(\bullet)^Q$ denotes optimum quantization, and $\varepsilon$ represents the quantization error between the original output and the output with optimized quantization (either for input data, weights, or both).

The mechanism of the present invention permits a user to select the quantization approach from among the above, enabling a trade-off between memory and accuracy. In some cases, memory utilization is improved by moving from quantized weights to quantized input data.

Traditionally, training input data is used to train the network and determine the appropriate weights. Once the weights are determined, quantization of the weights is then performed after training is complete. The quantization of the weights in this case are based on the particular distribution the input training data happens to have. It is, therefore, more likely to carry higher variance across the whole layer. When employing data-driven quantization, however, in many cases a localized subset of the neurons (even in MLP) are dominant to enable better quantization in terms of the observed quantization error owing to the narrower distribution of the information (i.e. smaller variance).

In one embodiment, the mechanism of the present invention relies on the fact that the entropy achieved by a quantization function that is only a function of the weights themselves is higher or equal to that achieved by introducing and considering input data along with the weights as a function to the quantization. This is expressed mathematically below:

$$H(W^Q = Q(W)) \geq H(W^Q = Q(W, x)) \qquad (5)$$

Where $Q(\bullet)$ denotes the quantization function, W are the weights, and x is the input data.

Figure 7:
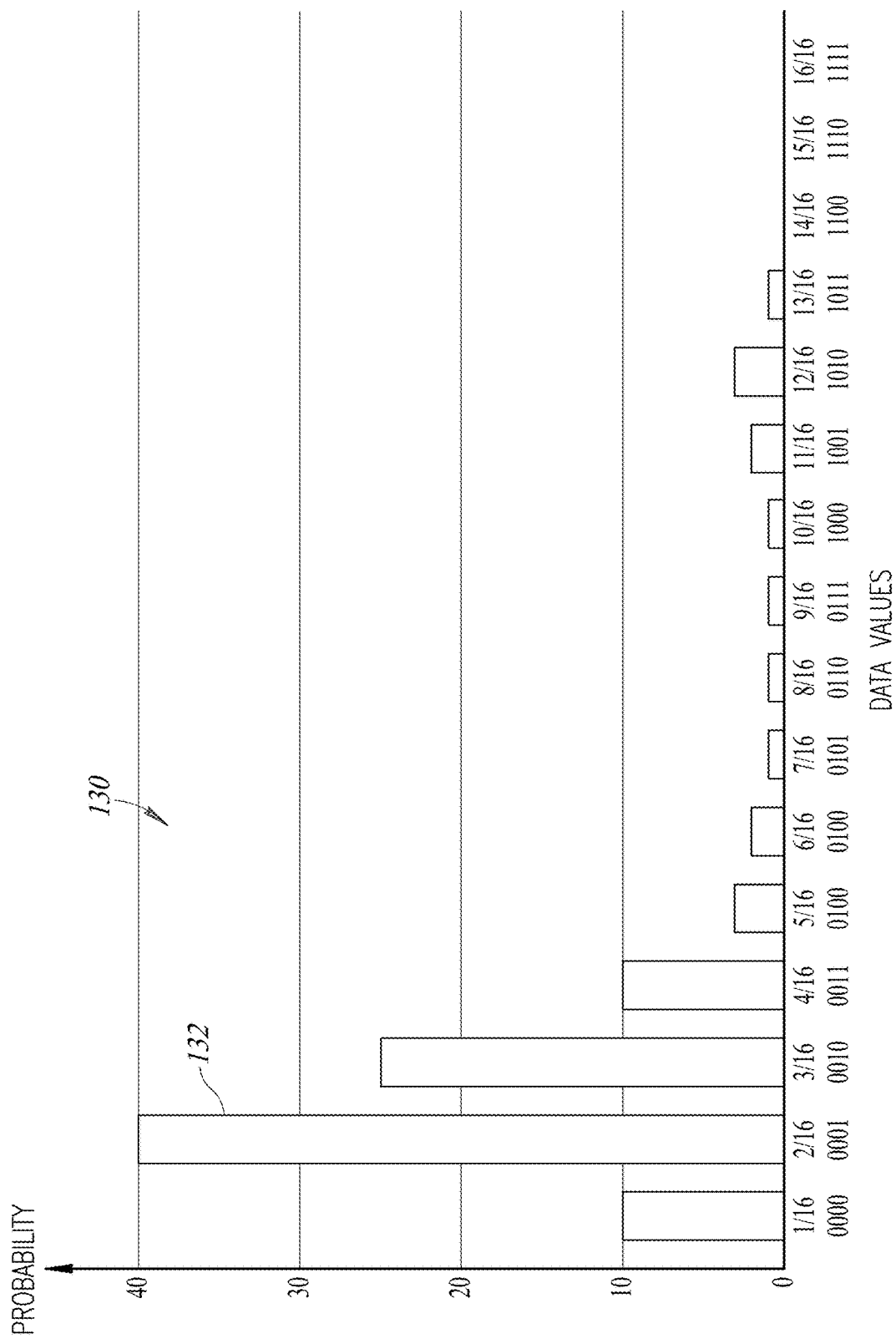
FIG. 7 is a diagram illustrating a first example histogram of neuron input data.

An example will now be presented to better illustrate the mechanism of the present invention. A diagram illustrating a first example histogram of neuron input data is shown in FIG. 7. Consider a histogram 130 representing the distribution function of 16-bit input data with each vertical bar (or bin) 132 representing the probability of getting that particular input value. If the histogram 130 represents, for example, a black and white image, the data represents a relatively dark image since most of the pixels are skewed to small values. The x-axis is labeled with the sixteen possible values expressed in decimal and binary. The distribution of the data is clearly skewed to lower values with the highest probability of getting the value '2'.

Now let us assume we have sixteen weight levels at some layer, that are uniformly distributed over the range [0, 1]. The optimum quantization is to have the weights represented with 4-bits corresponding to each level out of the 16 possible levels, i.e. 1/16, 2/16, . . . , 16/16. Let us observe, for example, a neuron for which all weights have converged to some value that represent an equal weight for all its inputs.

Figure 8:
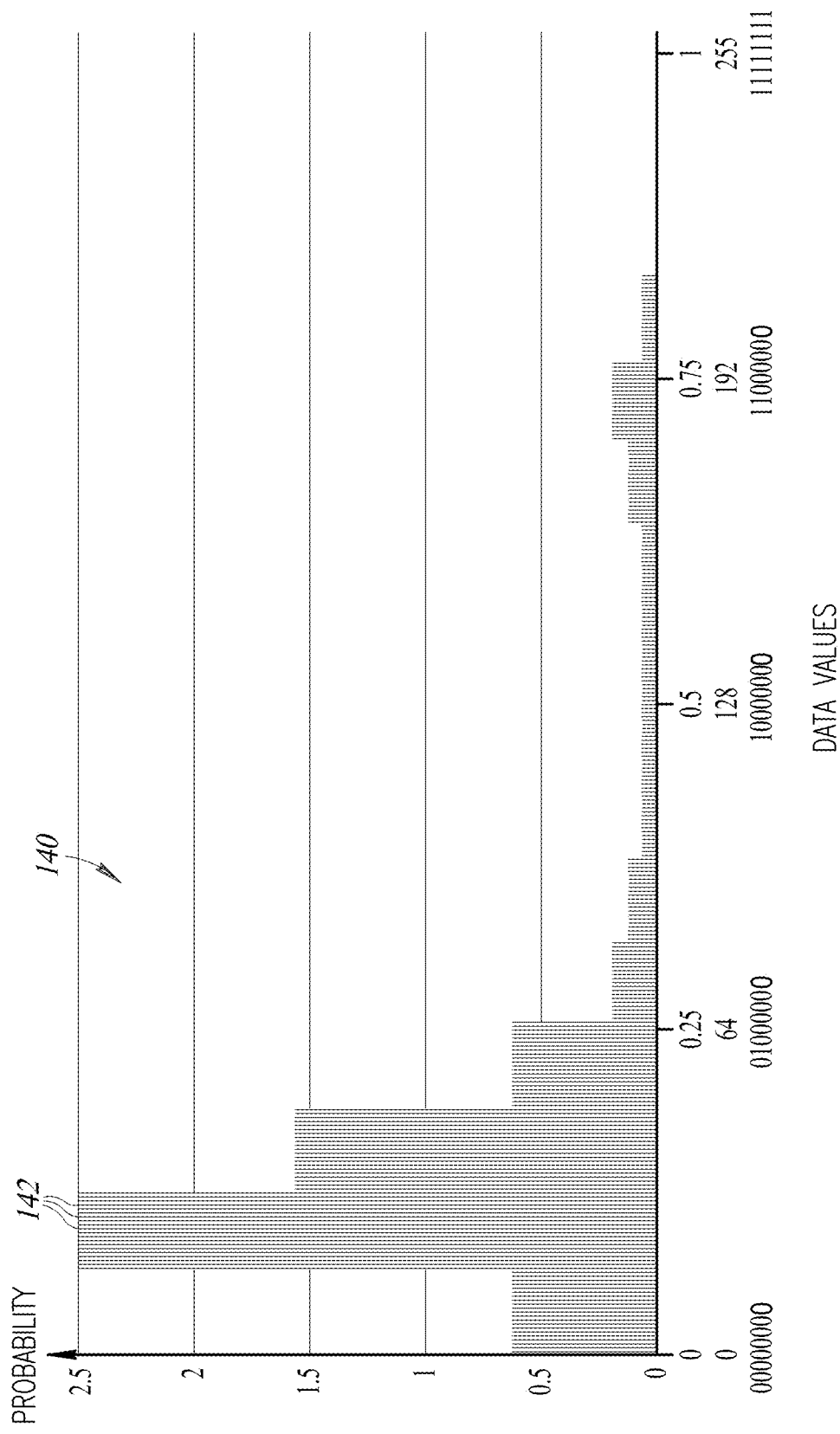
FIG. 8 is a diagram illustrating an example histogram of neuron output data.

Considering the above, the output of a dense layer (MLP), which is 8-bits wide (i.e. two 4-bit values multiplied together) would have a distribution identical to the input distribution as shown below in FIG. 8. The histogram 140 comprises vertical lines 142 representing the probability of that particular output value from the neuron. The values along the x-axis are expressed as 0 to 1 fraction, 0 to 255 decimal, and 0000 to 1111 binary.

Now, assume it is desired to quantize the weights such that the output value range is narrower. In prior art systems, without knowing anything about the input data, however, the only choice is to uniformly quantize the weights. Without the input data distribution or histogram, it is not possible to custom tailor the quantization of the weights. This results in a quantization error of ~9.5%, a nearly 10% average error.

It is clear, however, that by quantizing the weights around the lower end (i.e. centered around the highest likelihood) better representation can be obtained due to lower quantization error. Such a quantization approach would result in ~4.5% quantization error.

Figure 9:
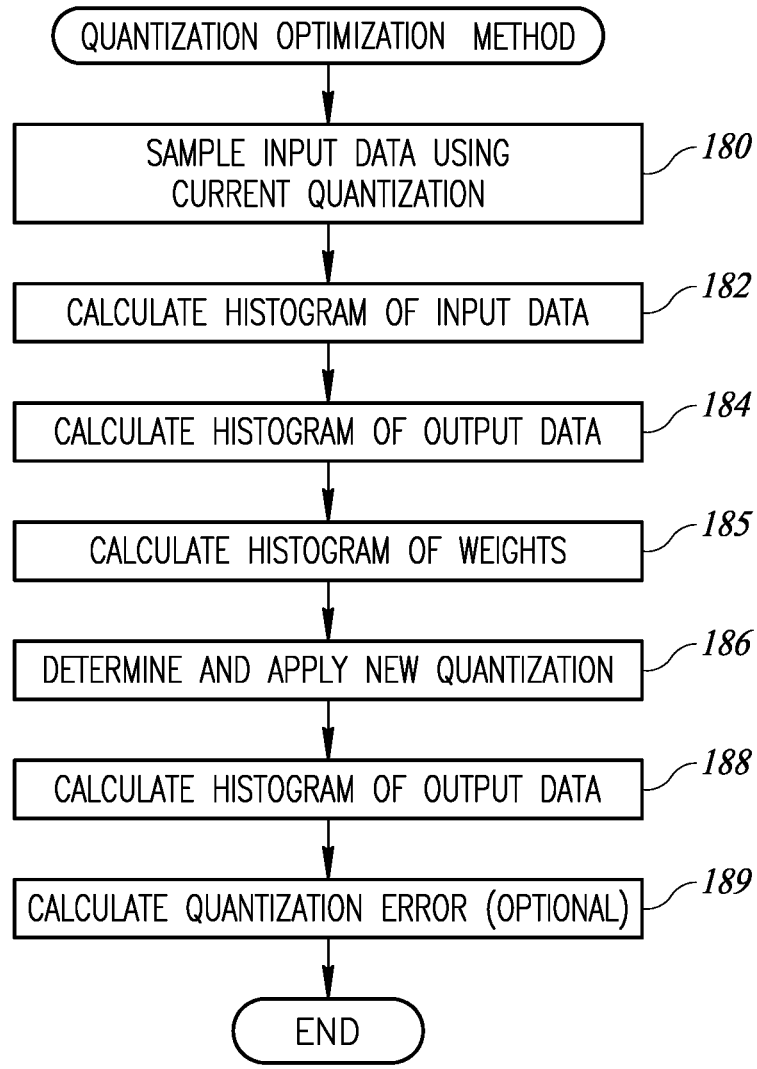
FIG. 9 is a flow diagram illustrating an example method of quantization optimization.

The mechanism of the present invention achieves this better quantization by taking into account the distribution of the input data. A flow diagram illustrating an example method of quantization optimization is shown in FIG. 9. Note that the method can be applied at any layer in the network. First, the input data is sampled using the current quantization scheme or representation depth (step 180). This may comprise weight quantization set during training mode. The histogram of the input data is then calculated (step 182). Note that the counters in the neurons are constantly tabulating the values that are input to the neuron during inference. Periodically, after observing a sufficient number of input values, the mechanism calculates the histogram. A similar process on the data output of the neuron is also performed (step 184). Note that the output is the product of the input data and the weights. Optionally, using a similar process as used on the input and output data, the distribution of the weights in each layer is also determined (step 185).

In accordance with the distributions (i.e. histograms) of the input data, output data, and/or the weights, an optimum quantization scheme is determined and applied to the input data, weights or both (step 186). Note that two quantization schemes are provided, described in more detail infra. The selection being based on a tradeoff between efficiency and accuracy. The histogram of the output data is calculated again (step 188) and the quantization error is calculated (step 189). Note that this step is optional and only performed if it is desired to estimate a performance metric related to the quantization scheme chosen and applied. Note also that the quantization error may be calculated using any suitable technique and is not critical to the invention.

Figure 10:
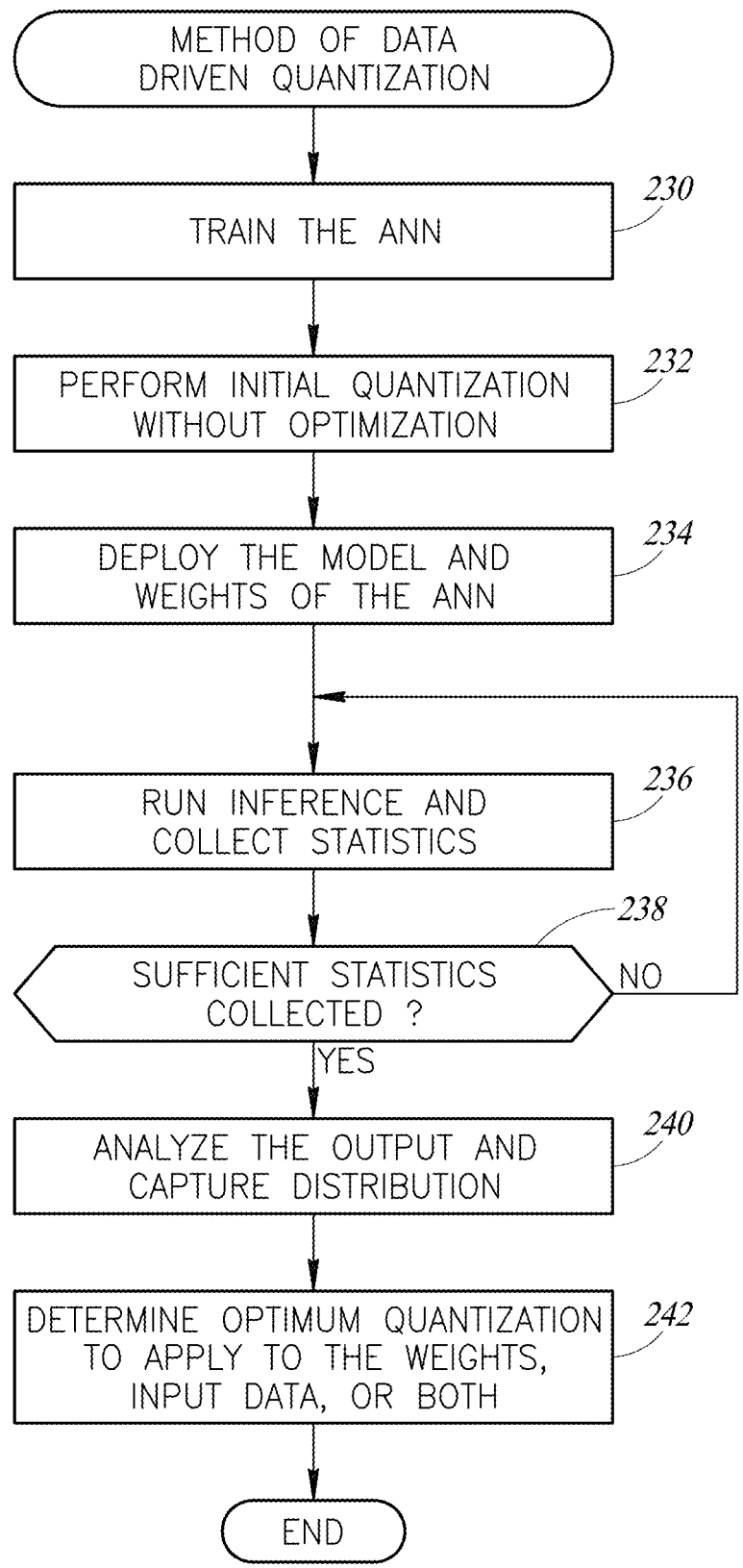
FIG. 10 is a flow diagram illustrating an example method of data driven quantization.

A flow diagram illustrating an example method of data driven quantization is shown in FIG. 10. Initially, the network is trained (step 230) and an initial quantization is applied without any consideration to optimization, i.e. the weights are quantized not to exceed the resource availability on the target device (step 232). This allows further quantization to leverage the input data. The neural network model and the weights are deployed (step 234). Inference is then run and data driven diagnosis is applied (step 236). In one embodiment, this is achieved by network manager logic in the core instructing layer controllers to collect statistics on neuronal activity (see FIG. 18). Statistics are gathered using a set of counters that count the level of activity observed at the neurons at each layer and which can be performed gradually as per resource availability, i.e. a larger network will take more time for the data collection. The activity monitored may include data input to the neuron, data output from the neuron, the internal weights, and any combination thereof.

When sufficient statistics have been collected (step 238) using a total counter that monitors the ensemble size, the controller is triggered to analyze the output (step 240). If not enough statistics have been collected, the method continues with step 236. At this point the output is analyzed for the distribution, and hypothesis testing is applied, i.e. input data, weights, or both are quantized according to the statistics obtained and checked against actual inputs. This is similar to the example described supra where knowledge is gained that the input image is 70% white.

Two quantization schemes are described below. The first is essentially a scaling and shift (i.e. bias) operation and the second is dropping one or more bits. Each is described along with an illustrative example.

Figure 11:
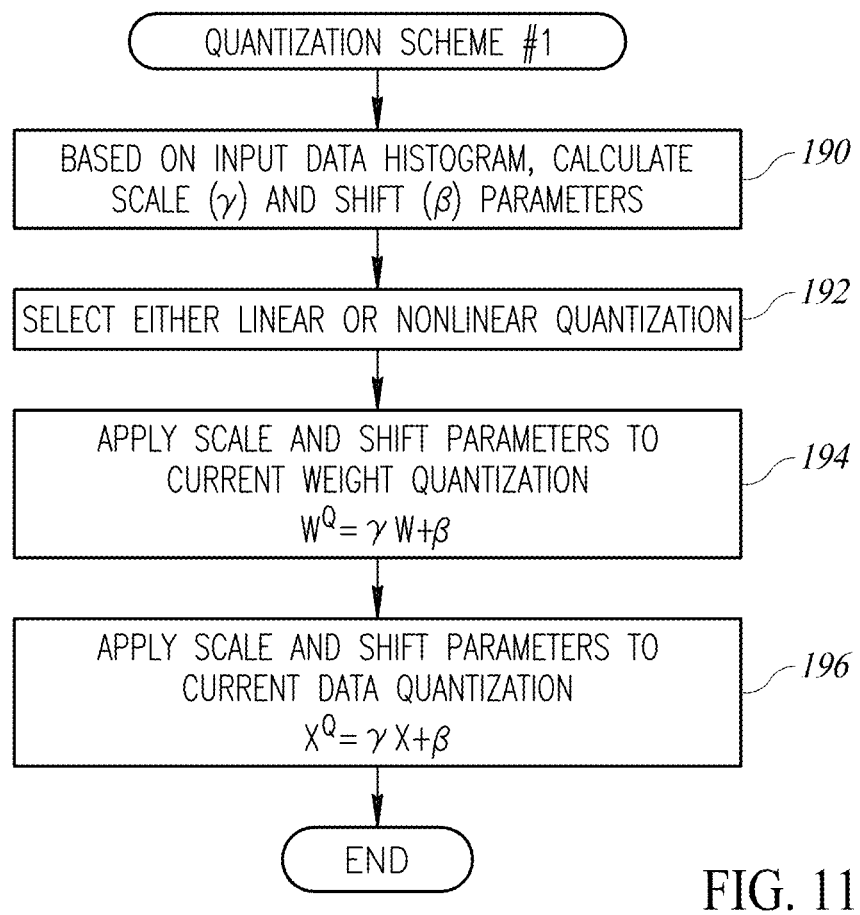
FIG. 11 is a flow diagram illustrating a first example quantization scheme.

A flow diagram illustrating a first example quantization scheme is shown in FIG. 11. Based on the input data distribution, the scale factor γ and shift or bias β parameters are calculated (step 190).

$$\gamma, \beta \Rightarrow (W^Q = \gamma \cdot W + \beta) \quad (6)$$

Figure 12:
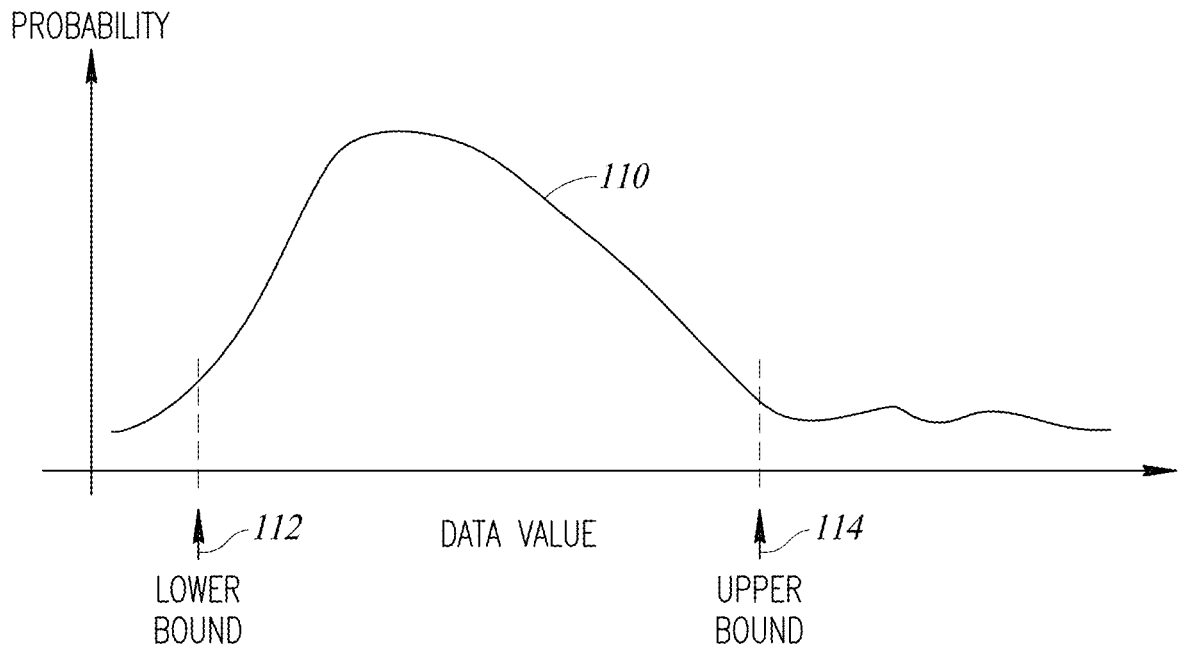
FIG. 12 is a diagram illustrating a second example histogram of neuron input data.

The scale factor indicates the custom range selected and the bias indicates the shift. Consider the histogram 110 of FIG. 12. The lower bound 112 and upper bound 114 define a range of values to be considered. The scaling factor will compress the full range of available values into the range between the two bounds. The bias indicates the shift, i.e. the lower bound, of where in the range to begin. The original number of values are reassigned to a narrower region to better represent where most of the data lies. Thus, the data between the bounds will be represented with a higher number of values thus improving efficiency and reducing quantization error.

Note that the quantization can be applied linearly or nonlinearly (step 192). The scale and shift parameters are then applied to the current weight quantization (step 194). The scale and shift parameters are applied to the current input data quantization (step 196). Note that the new quantization scheme can be applied to the weight, input data, or both.

In one embodiment, the scale factor γ and bias β parameters can be determined in the following manner. We define some distance measure $D(y, y^Q)$. Expressing $y^Q$ as a function of the quantization parameters, i.e. $y^Q = f(\gamma, \beta)$, an optimal solution is achieved by argmin D $(y, y^Q)$.

For example, $$\begin{aligned} D(y - y^Q) &= (y - y^Q)^2 \\ &= (y - \sigma(w^Q \cdot x + b^Q))^2 \\ &= (y - \sigma(\text{floor}(\gamma \cdot w + \beta) \cdot x + b^Q))^2 \end{aligned} \quad (7)$$

where γ and β are solved for using the following:

$$\gamma^*, \beta^* = \text{argmin} D \Rightarrow \frac{\partial D}{\partial \gamma} = 0; \frac{\partial D}{\partial \beta} = 0 \quad (8)$$

Figure 13:
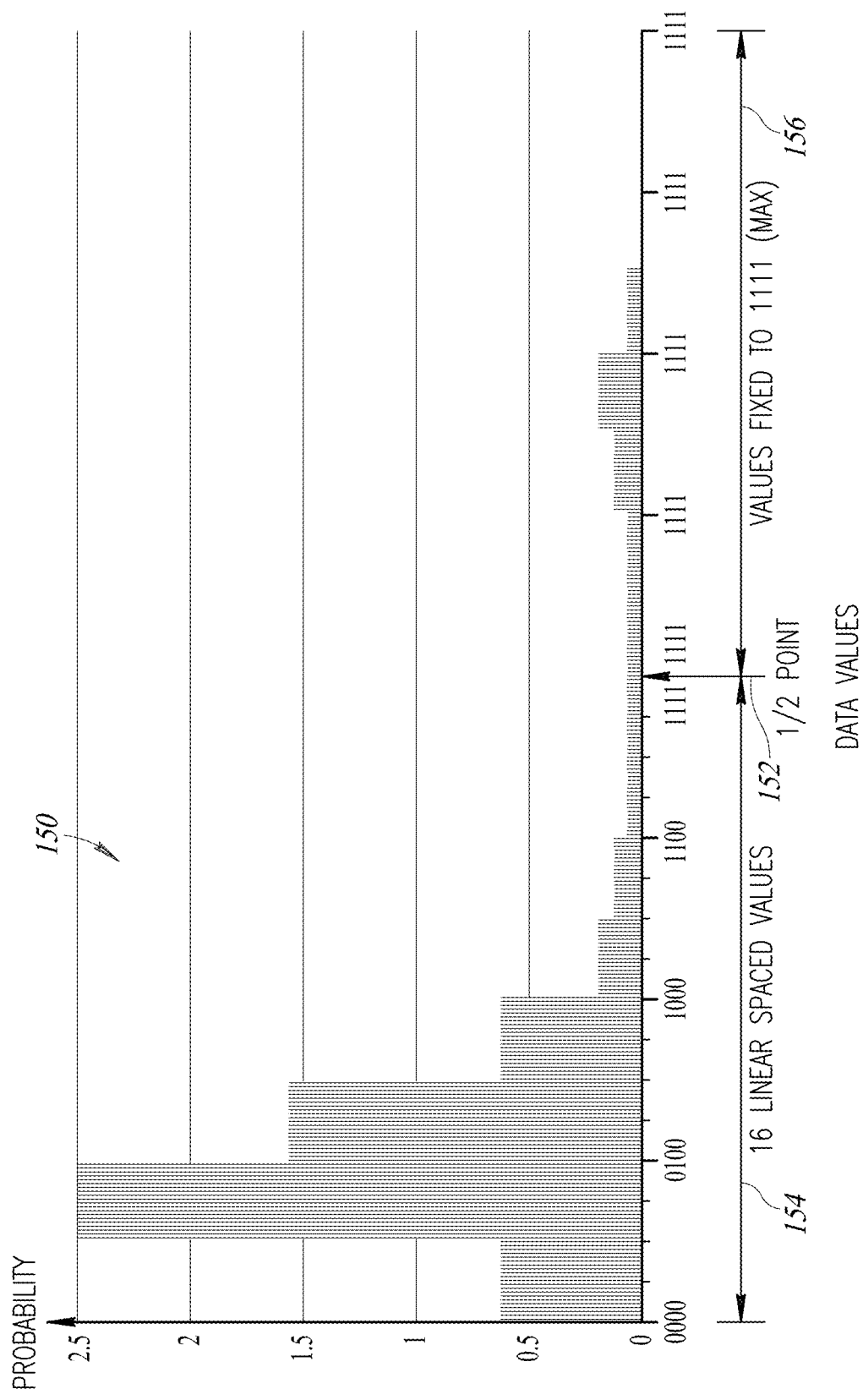
FIG. 13 is a diagram illustrating a first example quantization.

A diagram illustrating a first example quantization is shown in FIG. 13. In this example distribution 150, assume the analysis indicates to focus on the lower half of the range of values (as indicated by the half point arrow 152). Assuming linear spacing, the sixteen available values are spread linearly across the lower half 154 from 0000 to 1111. The value in the upper half 156 of the range are set to 1111. Now the bulk of the data will be represented with a higher number of values thus improving efficiency and reducing quantization error.

Note that there is tradeoff inherent in this process in that the quantization error is actually increased by fixing all values in the upper half to the maximum value 1111. Some data is effectively discarded by doing this. On the other hand, the quantization error is reduced by reassigning the values across a smaller region in the lower half where the bulk of the input data lies. The net result, however, is a significant improvement in quantization error.

Figure 14:
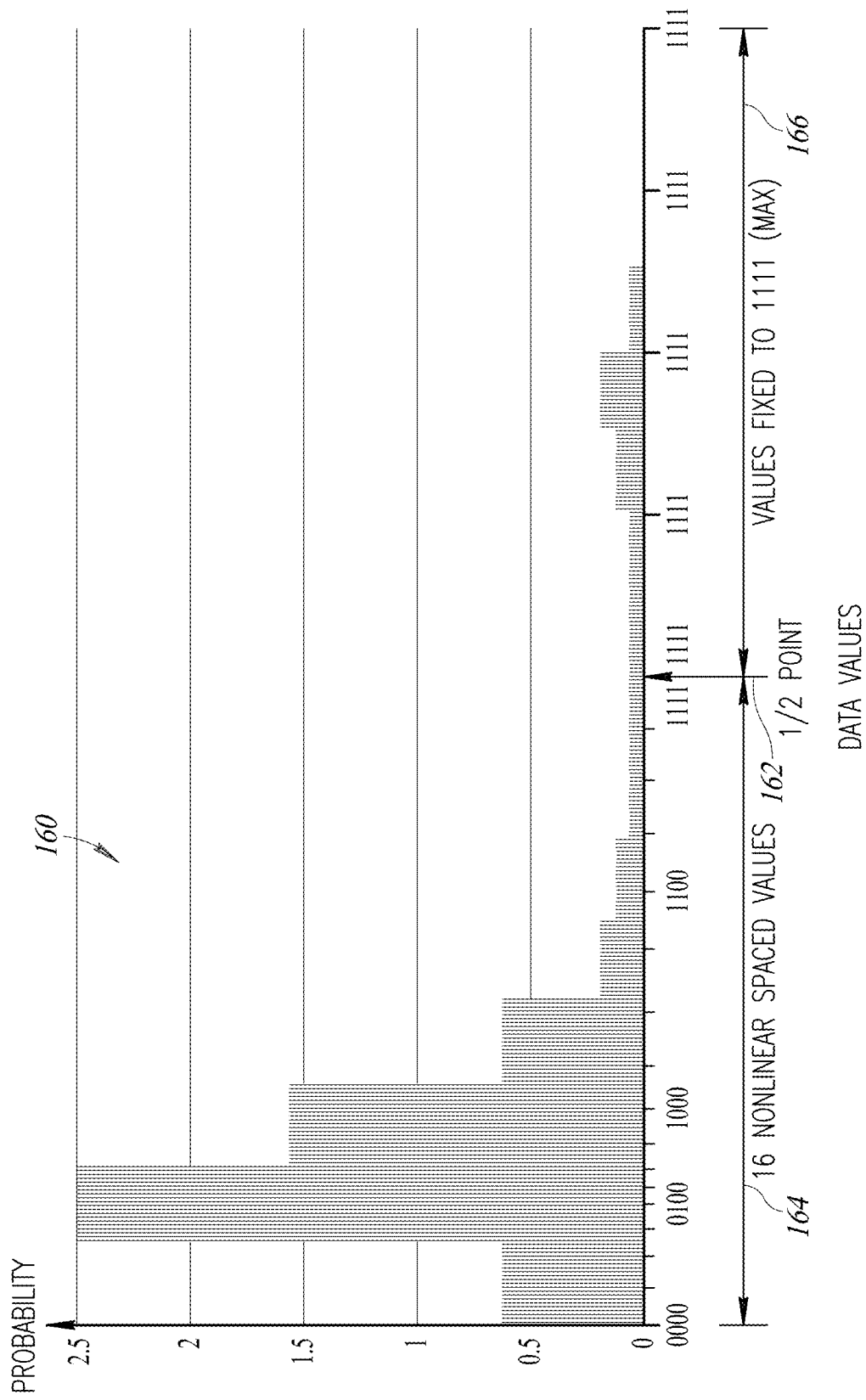
FIG. 14 is a diagram illustrating a second example quantization.

A diagram illustrating a second example quantization is shown in FIG. 14. This example is similar to the example of FIG. 13 with the difference being the nonlinear spacing used. Analysis of the histogram 160 yields a decision to apply the full range of sixteen values in the lower half 164 of the original data range (i.e. to the left of half point arrow 162). Values above this point 166 are set to the maximum 1111. Values below this point 164 are spaced apart nonlinearly, whereby the values associated with higher probability are assigned values closer together. For example, the values around 0100 are spaced closer together than those near 1100.

Figure 15:
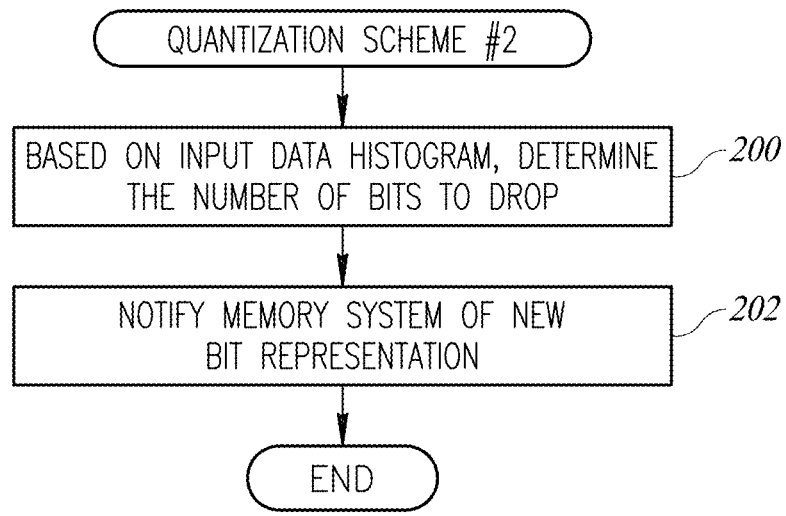
FIG. 15 is a flow diagram illustrating a second example quantization scheme.

A flow diagram illustrating a second example quantization scheme is shown in FIG. 15. In this second quantization scheme, rather than maintain the original bit width spread across a smaller range, one or more bits from the value representation are dropped (step 200). The number of bits to be dropped and from where (MSB, LSB, etc.) is based on the distribution of the input data. Once the quantization scheme is determined, the memory system is notified of the new bit representation (step 202). Depending on the implementation, this is necessary so that the memory system can reconfigure its memory and know how to represent the data therein.

The determination of how many bits γ to drop is a special case of Equations 7 and 8 supra, where the quantization is expressed as a binary shift right operation, and takes the following form:

$$w^Q = \text{floor}((w - \underline{w})/2^\gamma) \quad (9)$$

where $$\underline{w} = \text{average}(w) \quad (10)$$

and γ represents the number of bits to drop. Note that the nonlinear case may be approximated as a piecewise linear solution where each piece is centered around a local maxima and a solution (as described supra) is applied to it.

Figure 16:
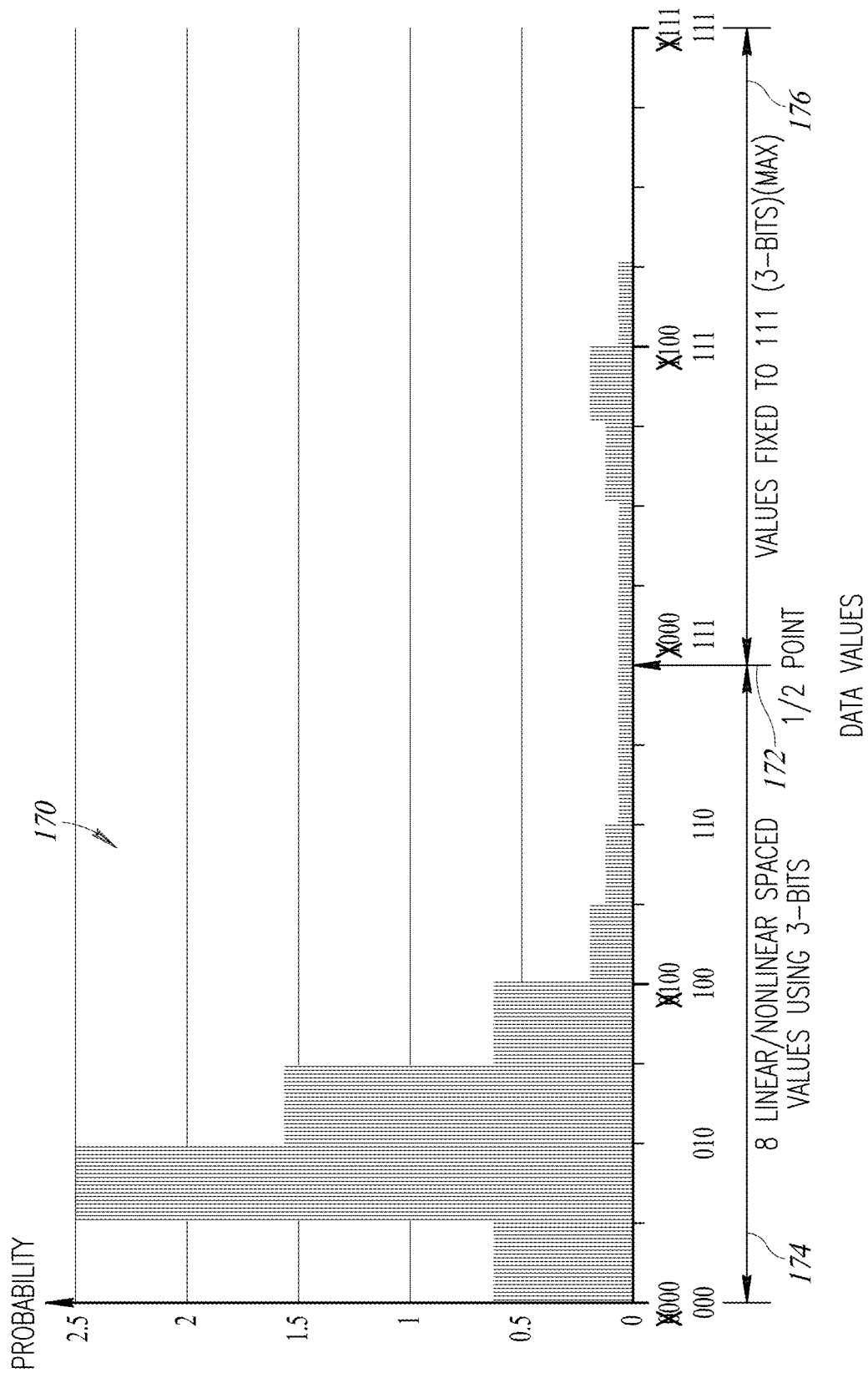
FIG. 16 is a diagram illustrating a third example quantization.

A diagram illustrating a third example quantization is shown in FIG. 16. In this example distribution 170, the analysis of the histogram yields a decision to drop the most significant bit (MSB) of each value. Since the bulk of the values lie within half the range, only three bits are required to represent the data rather than four. The range of values now spans from 000 to 111, rather than 0000 to 1111. This may increase the quantization error but memory efficiency is increased by 25%.

In one embodiment, in addition to dropping one or more bits, the reduced number of possible values may be assigned in a compressed fashion such as in FIGS. 13 and 14 described supra. In this example, all eight possible values are spread over the lower half 174 in either a linear or nonlinear manner. The values in the upper half 176 are set to the maximum 3-bit value 111. This serves to reduce the quantization error as well as increase memory efficiency.

Figure 17:
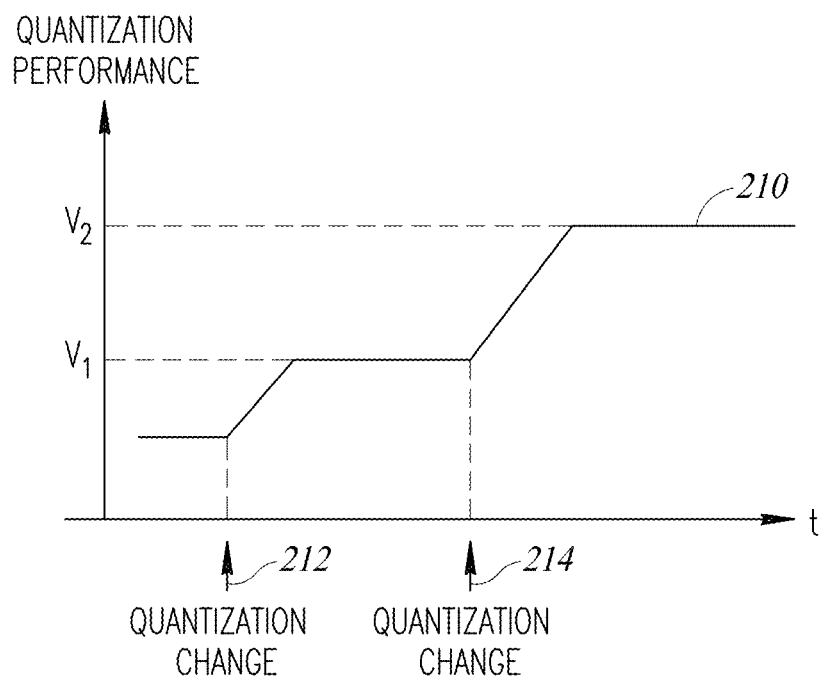
FIG. 17 is a diagram illustrating a graph of quantization performance versus time.

A diagram illustrating a graph of quantization performance versus time is shown in FIG. 17. The curve 210 represents the quantization performance achieved by the network over time. The quantization changes 212, 214 are applied as a result of the mechanism of the present invention. Each represents collection of statistics on the input and periodic analysis to determine a new quantization scheme (if any). Once the new quantization scheme is applied, its effects take hold after a transition period and the performance stabilizes. The assumption here is that the distribution of the input data is more or less static over time and that monitoring the counters over time will yield a stable response from the selected quantization scheme.

In this example, the mechanism was successful in increasing quantization performance from values $V_1$ to $V_2$ after application of new quantization schemes. In other words, the mechanism was able to dynamically adapt the quantization of the weights, input data, or both, by observing the input data and optimizing the quantization to best fit the distribution thereof.

Figure 18:
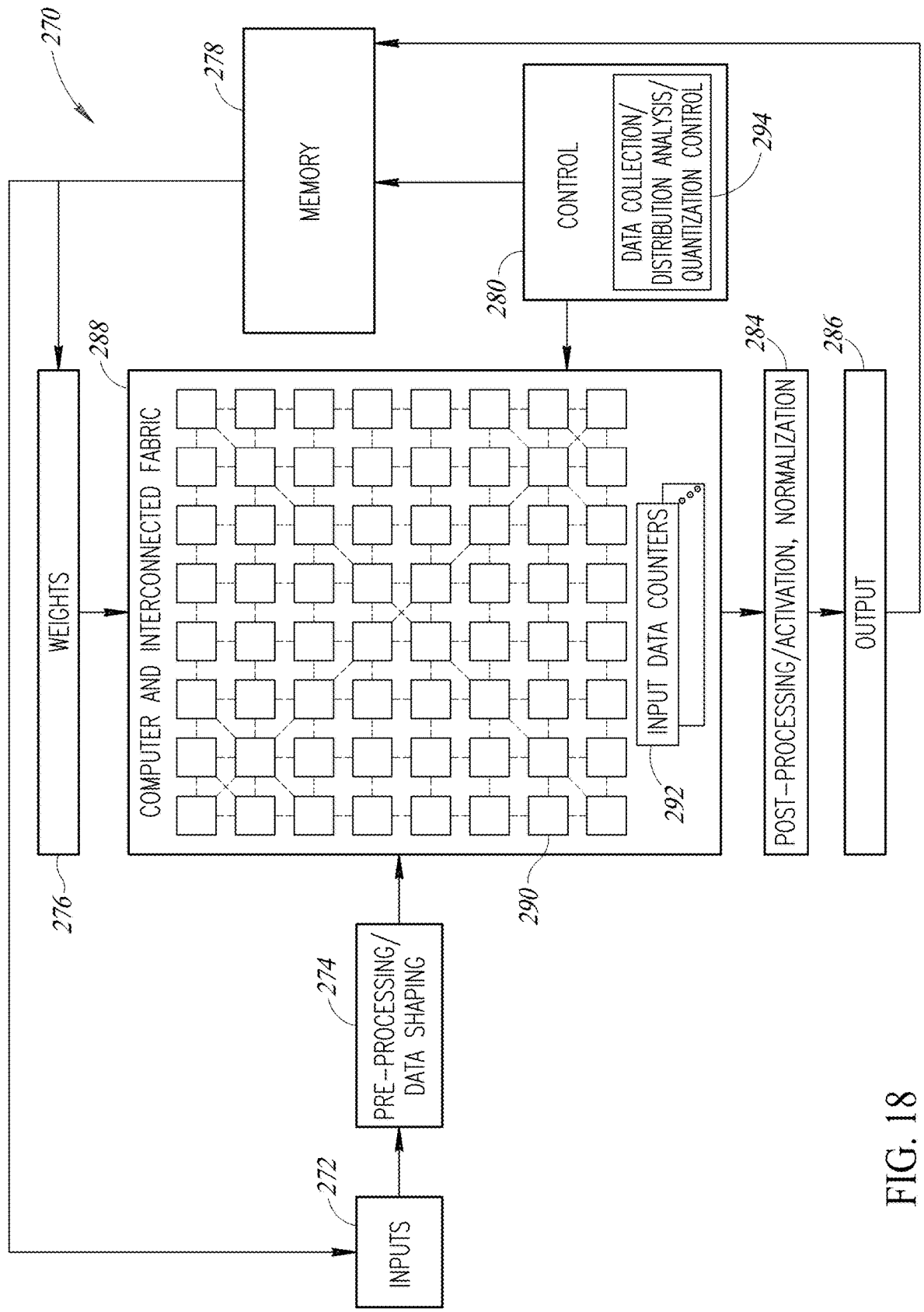
FIG. 18 is a block diagram illustrating an example integrated circuit device implementing the data driven quantization optimization mechanism of the present invention.

A block diagram illustrating an example integrated circuit device implementing the ANN of the present invention incorporating the data driven quantization optimization mechanism of the present invention is shown in FIG. 18. The device, generally referenced 270, comprises a control block 280 incorporating logic circuitry 282, memory block 278, inputs 272, pre-processing/data shaping block 274, weights block 276, computer and interconnected fabric 288, post-processing/activation, normalization block 284, and output block 286.

The device 270 describes a generalized version of a device that efficiently implements a neural network. It comprises an array of computational elements 288 (i.e. the fabric). Note that these elements are either physical or virtual entities that implement the mathematical computation required to obtain a desired output from the neural network.

The computational elements use two sets of data points, the inputs 272 and the weights 276 retrieved from memory 278. The inputs may be subject to pre-processing via block 274 and the outputs may be subject to post-processing via block 284.

A control entity 280 is operative to orchestrate the overall execution of the device by triggering data retrieval of inputs and weights from memory to the compute fabric 288, as well as triggering the execution of the compute fabric.

Note that in the context of the present invention, the components that are adapted to implement the invention may or may not participate in execution of the device, depending on the actual implementation.

In accordance with one embodiment of the present invention, the device 270 also comprises a plurality of counters 292 for tabulating the input data observed at the input to the neurons in any of the layers. In operation, the ANN is implemented in the fabric 288. Counters may be placed within the network to observe the data used to generate histograms of the data, as described in detail supra.

In one embodiment, the control block 280 is configured to, inter alia, control and administer the histogram data collected from the counters in the network, perform the analysis on the distribution, and periodically determine and apply new quantization schemes that optimally fit the current distribution of the input data.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus for optimizing quantization of a target artificial neural network (ANN) implemented on a neural network processor integrated circuit, comprising:
a computation fabric including an array of computational elements that are optimized to implement arithmetical computations to realize the target neural network;
a plurality of counters for constantly tabulating dynamically during inference input data observed at input to neurons and data output of the neurons in one or more layers of said target neural network, each counter in the neurons associated with each possible value bin of the input data;
a memory system operative to store weights and the input data;
a preprocessor operative to perform data shaping in each layer;
a post processor operative to perform one or more functions including activation and normalization in each layer;
a control circuit operative to perform histogram data collection from said plurality of counters at each neuron, analysis on distribution of data to calculate at least a scale factor $\gamma$ and shift $\beta$, to periodically determine a new quantization scheme that optimally fits a current distribution of input data, store said new quantization scheme in said memory system and notify said memory system of said new quantization scheme to reconfigure its memory resulting in more efficient memory utilization;
wherein said scale factory $\gamma$ indicates a custom range including an upper and lower bound whereby a full range of available quantization values are compressed and spread either linearly or nonlinearly throughout said custom range between said upper and lower bound via said control circuit;
wherein said shift indicates a quantization value where said custom range begins;
wherein an original number of quantization values for data stored in said memory system, are reassigned via said control circuit to a narrower region compared to an original assignment to allow data between said upper and lower bounds to be represented by a larger number of values thereby improving efficiency and reducing quantization error; and
wherein data in said ANN is quantized via a first circuit utilizing said reassigned quantization values, thereby reducing first quantization errors in said ANN by adjusting quantization to optimize the representation of data actually observed by said ANN.

2. The apparatus according to claim 1, wherein histogram data collection comprises generating a distribution of at least one of data input to said one or more layers, weight distribution of said one or more layers, and data output of said one or more layers.

3. The apparatus according to claim 1, wherein said control circuit is operative to calculate a second quantization error after available quantization values are compressed, whereby said second quantization error is utilized in periodically determining an updated quantization level.

4. The apparatus according to claim 1, wherein said control circuit is operative to analyze at least one of data input to at least one layer, data output from said at least one layer, and weights in said at least one layer and selecting a quantization level that minimizes a quantization error of output from said at least one layer.

5. The apparatus according to claim 1, wherein said control circuit operative to apply said compressed quantization values by assigning bit values over a smaller range compared to an original assignment of quantized weights and/or input data in an attempt to reduce quantization error.

6. The apparatus according to claim 1, wherein said control circuit operative to generate at least one of a scaling and bias parameter which is used in determining a quantization level.

7. The apparatus according to claim 1, wherein weights are quantized after training said target neural network is complete based on distribution of input data thereby improving performance of said target neural network.

8. The apparatus according to claim 1, wherein input data values below said lower bound are set to a minimum value representation and above said upper bound are set to a maximum value representation.

9. An apparatus for optimizing quantization of a target artificial neural network (ANN) implemented on a neural network processor integrated circuit, comprising:
a computation fabric including an array of computational elements that are optimized to implement arithmetical computations to realize the target neural network;
a plurality of counters for constantly tabulating dynamically during inference input data observed at input to neurons and data output of the neurons in one or more layers of said target neural network, each counter in the neurons associated with each possible value bin of the input data;
a memory system operative to store weights and the input data;
a preprocessor operative to perform data shaping in each layer;
a post processor operative to perform one or more functions including activation and normalization in each layer;
a control circuit operative to perform histogram data collection from said plurality of counters at each neuron, analysis on distribution of data to calculate a number of bits to drop from a value representation of data to yield a modified value representation, to periodically determine a new modified value representation that optimally fits a current distribution of input data, store said modified value representation in said memory system and notify said memory system of said modified value representation to reconfigure its memory resulting in more efficient memory utilization;
said control circuit operative to configure said memory system to operate with said modified value representation thereby improving memory utilization; and
wherein data in said ANN is quantized utilizing said modified value representation, thereby reducing first quantization errors in said ANN by adjusting quantization to optimize the representation of data actually observed by said ANN.

10. The apparatus according to claim 9, wherein said control circuit is operative to collect statistics by generating a histogram of input data and/or output data.

11. The apparatus according to claim 9, wherein said control circuit is operative to calculate a second quantization error after quantization of weights, data, or both said weights and data.

12. The apparatus according to claim 9, wherein the number of bits dropped from the value representation of data minimizes quantization error for an observed distribution of data.

13. The apparatus according to claim 9, wherein said control circuit is operative to assign bit values over a smaller range of quantized weights and/or input data compared to an original assignment in either a linear or nonlinear manner in an attempt to reduce quantization error.

14. The apparatus according to claim 9, wherein quantization comprises generating at least one of a scaling and bias parameter which is used in determining said quantization.

15. The apparatus according to claim 9, wherein input data values below a lower bound are set to a minimum value representation and above an upper bound are set to a maximum value representation.

16. An apparatus for optimizing quantization of a target artificial neural network (ANN) implemented on a neural network processor integrated circuit, comprising:
- a computation fabric including an array of computational elements that are optimized to implement arithmetical computations to realize the target neural network;
- a plurality of counters for constantly tabulating dynamically during inference input data observed at input to neurons and data output of the neurons in one or more layers of said target neural network, each counter in the neurons associated with each possible value bin of the input data;
- a memory system operative to store weights and the input data;
- a preprocessor operative to perform data shaping in each layer;
- a post processor operative to perform one or more functions including activation and normalization in each layer;
- a control circuit operative to perform histogram data collection from said plurality of counters at each neuron, analysis on distribution of data to calculate at least a scale factor $\gamma$ and shift $\beta$ as well as determine a number of bits to drop from a value representation of data to yield a modified value representation, to periodically determine a new quantization scheme that optimally fits a current distribution of input data, store said new quantization scheme in said memory system and notify said memory system of said new quantization scheme to reconfigure its memory to operate with said new quantization scheme and said modified value representation thereby resulting in more efficient memory utilization;
- wherein said scale $\gamma$ factory indicates a custom range including an upper and lower bound whereby a full range of available quantization values are compressed and spread either linearly or nonlinearly throughout said custom range between said upper and lower bound via said control circuit;
- wherein said shift indicates a quantization value where said custom range begins;
- wherein an original number of quantization values for data stored in said memory system, are reassigned via said control circuit to a narrower region compared to an original assignment to allow data between said upper and lower bounds to be represented by a larger number of values thereby improving efficiency and reducing quantization error; and
- wherein data in said ANN is quantized via a first circuit utilizing said reassigned quantization values, thereby reducing first quantization errors in said ANN by adjusting quantization to optimize the representation of data actually observed by said ANN.

17. The apparatus according to claim 16, wherein collecting statistics comprises generating one or more histograms of input data and/or output data.

18. The apparatus according to claim 16, wherein data quantization comprises analyzing the data and selecting a quantization level that minimizes a quantization error.

19. The apparatus according to claim 16, further comprising dropping one or more bits used to represent quantized weights and/or input data in an attempt to improve memory utilization.

20. The apparatus according to claim 16, wherein input data values below said lower bound are set to a minimum value representation and above said upper bound are set to a maximum value representation.

* * * * *